(12) United States Patent
Sengoku et al.

(10) Patent No.: US 9,313,058 B2
(45) Date of Patent: Apr. 12, 2016

(54) COMPACT AND FAST N-FACTORIAL SINGLE DATA RATE CLOCK AND DATA RECOVERY CIRCUITS

(71) Applicant: QUALCOMM Incorporated, San Diego, CA (US)

(72) Inventors: Shoichiro Sengoku, San Diego, CA (US); George Alan Wiley, San Diego, CA (US); Chulkyu Lee, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/459,132

(22) Filed: Aug. 13, 2014

(65) Prior Publication Data

US 2014/0348214 A1    Nov. 27, 2014

Related U.S. Application Data

(63) Continuation-in-part of application No. 14/252,450, filed on Apr. 14, 2014, which is a continuation-in-part of application No. 14/199,322, filed on Mar. 6, 2014, which is a continuation-in-part of application No.

(Continued)

(51) Int. Cl.
*H04B 1/00* (2006.01)
*H04L 25/40* (2006.01)
(Continued)

(52) U.S. Cl.
CPC .... *H04L 25/40* (2013.01); *H03L 7/00* (2013.01); *H04L 7/0276* (2013.01); *H04L 7/033* (2013.01); *H04L 7/04* (2013.01); *H04L 25/493* (2013.01)

(58) Field of Classification Search
None
See application file for complete search history.

(56) References Cited

U.S. PATENT DOCUMENTS 4,644,547 A    2/1987    Vercellotti et al.
4,839,907 A    6/1989    Saneski
(Continued)

FOREIGN PATENT DOCUMENTS

DE           3329773 A1    2/1985
DE     102004013093 B3    7/2005
(Continued)

OTHER PUBLICATIONS

International Search Report and Written Opinion—PCT/US2014/065169—ISA/EPO—Mar. 3, 2015.
(Continued)

*Primary Examiner* — Adolf Dsouza
(74) *Attorney, Agent, or Firm* — Loza & Loza, LLP

(57) ABSTRACT

A plurality of line interfaces is configured to receive a spread signal over the plurality of line interface. The spread signal carrying symbols with guaranteed symbol-to-symbol state transitions between consecutive symbols. The spread signal is defined by a plurality of transition signals including a first signal over a first line interface. A clock signal is extracted based on a comparison between a first instance of the first signal and a delayed second instance of the first signal. The delayed second instance of the first signal is sampled based on the clock signal to provide a symbol output. The clock extraction circuit is further adapted to generate the clock signal based on additional comparisons between a first instance of a second signal, within the plurality of transition signals, and a delayed second instance of the second signal, where the first and second signals are concurrent signals received over different line interfaces.

29 Claims, 15 Drawing Sheets

Related U.S. Application Data

14/220,056, filed on Mar. 19, 2014.

(60) Provisional application No. 61/886,567, filed on Oct. 3, 2013, provisional application No. 61/774,247, filed on Mar. 7, 2013, provisional application No. 61/774,408, filed on Mar. 7, 2013, provisional application No. 61/778,768, filed on Mar. 13, 2013, provisional application No. 61/803,684, filed on Mar. 20, 2013, provisional application No. 61/846,977, filed on Jul. 16, 2013.

(51) Int. Cl.
  *H04L 7/04* (2006.01)
  *H03L 7/00* (2006.01)
  *H04L 7/027* (2006.01)
  *H04L 7/033* (2006.01)
  *H04L 25/493* (2006.01)

(56) References Cited

U.S. PATENT DOCUMENTS

| | | | |
|---|---|---|---|
| 5,493,538 A | 2/1996 | Bergman | |
| 5,703,914 A | 12/1997 | Nakamura | |
| 5,862,180 A | 1/1999 | Heinz | |
| 5,959,568 A | 9/1999 | Woolley | |
| 6,320,406 B1 | 11/2001 | Morgan et al. | |
| 6,320,437 B1 | 11/2001 | Ma | |
| 6,526,112 B1 | 2/2003 | Lai | |
| 6,556,628 B1 | 4/2003 | Poulton et al. | |
| 6,624,766 B1 | 9/2003 | Possley et al. | |
| 6,728,908 B1 | 4/2004 | Fukuhara et al. | |
| 6,836,522 B1 | 12/2004 | Wakayama | |
| 6,874,097 B1 | 3/2005 | Aliahmad et al. | |
| 6,933,866 B1 | 8/2005 | Weitz | |
| 7,061,939 B1 | 6/2006 | Chengson et al. | |
| 7,076,377 B2 | 7/2006 | Kim et al. | |
| 7,167,527 B1 | 1/2007 | Park et al. | |
| 7,190,754 B1 | 3/2007 | Chang et al. | |
| 7,339,502 B2 | 3/2008 | Furtner | |
| 7,358,869 B1 | 4/2008 | Chiarulli et al. | |
| 7,395,347 B2 | 7/2008 | Nemawarkar et al. | |
| 7,463,680 B2 | 12/2008 | Buckwalter et al. | |
| 7,502,953 B2 | 3/2009 | Boecker et al. | |
| 7,667,500 B1 | 2/2010 | Alfke | |
| 7,715,509 B2 | 5/2010 | Stojanovic et al. | |
| 7,741,876 B2 | 6/2010 | Fusayasu et al. | |
| 7,781,677 B2 | 8/2010 | Matsubara et al. | |
| 7,983,347 B2 | 7/2011 | Hamada et al. | |
| 8,000,412 B1 | 8/2011 | Loinaz | |
| 8,159,376 B2 | 4/2012 | Abbasfar | |
| 8,184,760 B2 | 5/2012 | Chien et al. | |
| 8,264,253 B2 | 9/2012 | Tian et al. | |
| 8,284,848 B2 | 10/2012 | Nam et al. | |
| 8,446,903 B1 | 5/2013 | Ranganathan et al. | |
| 8,621,128 B2 | 12/2013 | Radulescu et al. | |
| 8,649,460 B2 | 2/2014 | Ware et al. | |
| 8,659,957 B2 | 2/2014 | Sekine | |
| 8,686,754 B2 | 4/2014 | Chopra et al. | |
| 8,848,810 B2 | 9/2014 | Lee et al. | |
| 9,071,220 B2 | 6/2015 | Sengoku et al. | |
| 9,203,599 B2 | 12/2015 | Sengoku | |
| 2004/0203559 A1 | 10/2004 | Stojanovic et al. | |
| 2005/0053171 A1 | 3/2005 | Pickering et al. | |
| 2005/0069071 A1 | 3/2005 | Kim et al. | |
| 2005/0104649 A1 | 5/2005 | Yonezawa | |
| 2005/0140415 A1 | 6/2005 | Hazucha et al. | |
| 2005/0218953 A1 | 10/2005 | Slawecki | |
| 2006/0006902 A1 | 1/2006 | Sagiv | |
| 2006/0061494 A1* | 3/2006 | Hosaka et al. | 341/50 |
| 2006/0132335 A1 | 6/2006 | Kojima | |
| 2007/0073932 A1 | 3/2007 | Pike et al. | |
| 2007/0188187 A1 | 8/2007 | Oliva et al. | |
| 2007/0241836 A1 | 10/2007 | Miller | |
| 2008/0063127 A1 | 3/2008 | Hayashi et al. | |
| 2008/0159432 A1 | 7/2008 | Ng | |
| 2008/0165732 A1 | 7/2008 | Kim et al. | |
| 2008/0212709 A1 | 9/2008 | Wiley | |
| 2009/0080584 A1 | 3/2009 | Hamano et al. | |
| 2009/0195699 A1 | 8/2009 | Hamada et al. | |
| 2009/0243681 A1 | 10/2009 | Zerbe et al. | |
| 2010/0001758 A1 | 1/2010 | Dreps et al. | |
| 2010/0002819 A1 | 1/2010 | Conner | |
| 2010/0027607 A1 | 2/2010 | Kwasniewski et al. | |
| 2010/0040169 A1 | 2/2010 | Abbasfar | |
| 2010/0111207 A1 | 5/2010 | Suda et al. | |
| 2010/0264967 A1 | 10/2010 | Lee, Jr. et al. | |
| 2011/0013707 A1 | 1/2011 | Walker et al. | |
| 2011/0176646 A1* | 7/2011 | Pal et al. | 375/354 |
| 2011/0197086 A1 | 8/2011 | Rivoir | |
| 2011/0216863 A1 | 9/2011 | Tomita et al. | |
| 2011/0249781 A1* | 10/2011 | Guillot | 375/354 |
| 2012/0020660 A1 | 1/2012 | Le Taillandier De Gabory et al. | |
| 2012/0213299 A1 | 8/2012 | Cronie et al. | |
| 2012/0223754 A1 | 9/2012 | Lewis | |
| 2012/0224656 A1 | 9/2012 | Aoki | |
| 2013/0225067 A1 | 8/2013 | Card et al. | |
| 2013/0241759 A1 | 9/2013 | Wiley et al. | |
| 2013/0279551 A1 | 10/2013 | Fujimori et al. | |
| 2013/0294490 A1 | 11/2013 | Chandrasekaran et al. | |
| 2014/0254732 A1 | 9/2014 | Sengoku et al. | |
| 2014/0254733 A1 | 9/2014 | Sengoku et al. | |
| 2014/0270026 A1 | 9/2014 | Sengoku et al. | |
| 2014/0286389 A1 | 9/2014 | Zerbe et al. | |
| 2014/0286466 A1 | 9/2014 | Sengoku et al. | |
| 2015/0043358 A1 | 2/2015 | Wiley et al. | |
| 2015/0098536 A1 | 4/2015 | Sengoku | |
| 2015/0098537 A1 | 4/2015 | Sengoku | |
| 2015/0098538 A1 | 4/2015 | Wiley et al. | |
| 2015/0220472 A1 | 8/2015 | Sengoku | |
| 2015/0295701 A1 | 10/2015 | Sengoku | |
| 2016/0028534 A1 | 1/2016 | Sengoku | |

FOREIGN PATENT DOCUMENTS

| | | |
|---|---|---|
| EP | 1385306 A1 | 1/2004 |
| GB | 2456517 A | 7/2009 |
| JP | 2008242884 A | 10/2008 |
| WO | WO-2007009038 A2 | 1/2007 |
| WO | WO-2008109478 A2 | 9/2008 |
| WO | WO-2008151251 A1 | 12/2008 |
| WO | WO-2009086078 A1 | 7/2009 |
| WO | WO-2009111175 A1 | 9/2009 |

OTHER PUBLICATIONS

Muller P., et al., "Top-Down Design of a Low-Power Multi-Channel 2.5-Gbit/s/Channel Gated Oscillator Clock-Recovery Circuit", Design, Automation and Test in Europe, 2005. Proceedings Munich, Germany Mar. 7-11, 2005, Piscataway, NJ, USA, IEEE, Mar. 7, 2005, pp. 258-263, XP010779962, ISBN: 978-0-7695-2288-3.

Bell A G., et al., "WAM 7.1: A Single Chip Nmos Ethernet Controller", IEEE: International Solid—State Circuits Conference, XX, XX, Feb. 23, 1983, XP001 039599, pp. 13-78.

Vitesse, "VSC7226 Quad 3.125Gb/s Backplane Transceiver," Vitesse Semiconductor Corporation, PB-VSC7226-002, 2002, 2 pages.

"Draft MIPI Alliance Specification for Camera Serial Interface 2 (CSI-2)" In:"Draft MIPI Alliance Specification for Camera Serial Interface 2 (CSI-2)", Apr. 2, 2009, XP055165978, 6. Camera Control Interface (CCI) 529-728.

"MIPI Alliance Specification for D-PHY," Sep. 22, 2009, pp. 1-125, XP055057664 [Retrieved on Mar. 25, 2013].

Poulton J W., et al., "Multiwire Differential Signaling", 20030806 No. 1.1 Aug. 6, 2003, pp. 1-20, XP002610849, Retrieved from the Internet: URL:http://www.cs.unc.eduf-jpfmwire.pdf [retrieved on Nov. 23, 2011] the whole document.

(56) References Cited

OTHER PUBLICATIONS

Williams A., "Synopsys describes MIPI DigRF protocol for 4G mobile," Retrieved from the Internet <URL: http://www.electronicsweekly.com/news/design/eda-and-ip/synopsys-describes-mipi-digrf-protocol-for-4g-mobile-2012-03/ >, 2012, 6 pages.

Zhu C., et al., "Multi-Machine Communication Based on I2C-Bus," Sensors & Transducers, Jul. 2014, vol. 174 (7), pp. 138-143.
Zogopoulos S., et al., "High-Speed Single-Ended Parallel Link Based on Three-Level Differential Encoding", IEEE Journal of Solid-State Circuits, IEEE Service Center, Piscataway, NJ, USA, vol. 44, No. 2, Feb. 1, 2009, pp. 549-557, XP011243176, ISSN: 0018-9200, DOI: 10.1109/JSSC.2008.2011038 the whole document.

* cited by examiner

COMPACT AND FAST N-FACTORIAL SINGLE DATA RATE CLOCK AND DATA RECOVERY CIRCUITS

CLAIM OF PRIORITY UNDER 35 U.S.C. §119

The present application is a continuation-in-part of, and claims priority to,

U.S. Utility patent application Ser. No. 14/252,450 entitled "N Factorial Dual Data Rate Clock and Data Recovery", filed Apr. 14, 2014, which claims priority to U.S. Provisional Application No. 61/886,567 entitled "N Factorial Clock And Data Recovery With Negative Hold Time Sampling" filed Oct. 3, 2013;

U.S. Utility patent application Ser. No. 14/199,322 entitled "Circuit To Recover A Clock Signal From Multiple Wire Data Signals That Changes State Every State Cycle And Is Immune To Data Inter-Lane Skew As Well As Data State Transition Glitches", filed Mar. 26, 2014, which claims priority to U.S. Provisional Application No. 61/774,247 entitled "Circuit To Recover A Clock Signal From Multiple Wire Data Signals That Changes State Every State Cycle And Is Immune To Data Inter-Lane Skew As Well As Data State Transition Glitches", filed Mar. 7, 2013, U.S. Provisional Application No. 61/774,408 entitled "Transcoding Method For Multi-Wire Signaling That Embeds Clock Information In Transition Of Signal State", filed Mar. 7, 2013, and U.S. Provisional Application No. 61/778,768 entitled "Transcoding Method For Multi-Wire Signaling That Embeds Clock Information In Transition Of Signal State", filed Mar. 13, 2013; and U.S. Utility patent application Ser. No. 14/220,056 entitled "Multi-Wire Open-Drain Link with Data Symbol Transition Based Clocking", filed Mar. 19, 2014, which claims priority to U.S. Provisional Application No. 61/803,684 entitled "Multi-Wire Open-Drain Link With Data Symbol Transition Based Clocking", filed Mar. 20, 2013, and U.S. Provisional Application No. 61/846,977 entitled "Multi-Wire Open-Drain Link With Data Symbol Transition Based Clocking", filed Jul. 16, 2013, all of which are assigned to the assignee hereof and hereby expressly incorporated by reference herein.

BACKGROUND

1. Field

The present disclosure relates generally to an interface between a host processor and a peripheral device such as a camera or sensor and, more particularly, to improving clock generation for single data rate data transfer on an N-wire communication interface.

2. Background

Manufacturers of mobile devices, such as cellular phones, may obtain components of the mobile devices from various sources, including different manufacturers. For example, an application processor in a cellular phone may be obtained from a first manufacturer, while the display for the cellular phone may be obtained from a second manufacturer. The application processor and a display or other device may be interconnected using a standards-based or proprietary physical interface. For example, a display may provide an interface that conforms to the Display System Interface (DSI) standard specified by the Mobile Industry Processor Interface Alliance (MIPI).

In one example, a multi-signal data transfer system may employ multi-wire differential signaling such as 3-phase or N-factorial (N!) low-voltage differential signaling (LVDS), transcoding (e.g., the digital-to-digital data conversion of one encoding type to another) may be performed to embed symbol clock information by causing a symbol transition at every symbol cycle, instead of sending clock information in separate data lanes (differential transmission paths). Embedding clock information by transcoding is an effective way to minimize skew between clock and data signals, as well as to eliminate the necessity of a phase-locked loop (PLL) to recover the clock information from the data signals.

Clock and data recovery (CDR) circuits are decoder circuits that extract data signals as well as a clock signals from multiple data signals. However, clock recovery from multiple data signals whose state transitions represent clock events often suffers unintended spike pulses on its recovered clock signal due to inter-lane skew of the data signals or glitch signals by intermediate or undeterminable data signal states at data transition times. For instance, such clock signal may be susceptible to jitter. Jitter is how early or late a signal transition is with reference to when it should transition. Jitter is undesirable because it causes transmission errors and/or limits the transmission speed. The recovered clock signal may be used to extract data symbols encoded within the multiple wires/conductors.

Therefore, a clock recovery circuit is needed that minimizes analog delays, is tolerant to jitter, and is scalable in multi-signal systems having different numbers of conductors.

SUMMARY

A receiver circuit may comprise a plurality of line interfaces, a plurality of receivers, a clock extraction circuit, and a negative hold time logic circuit. The plurality of line interfaces may be configured to receive a spread signal distributed over the plurality of line interfaces, the spread signal carrying symbols with guaranteed symbol-to-symbol state transitions between consecutive symbols, the spread signal defined by a plurality of state transition signals including a first signal over a first line interface. The plurality of receivers may be coupled to the line interfaces. In one example, the plurality of receivers may be differential receivers and the first signal is a differential signal. In another example, the plurality of receivers may be single-ended receivers and the first signal is a single-ended signal. In various examples, the spread signal may be one of a N-factorial (N!) encoded signal, a three-phase encoded signal, and/or a N-phase encoded signal.

The clock extraction circuit may be adapted to obtain a clock signal based on a comparison between a first instance of the first signal, and a delayed second instance of the first signal. The negative hold time logic circuit may be adapted to sample the delayed second instance of the first signal based on the clock signal and provide a symbol output.

In one implementation, the clock extraction circuit may be further adapted to generate the clock signal based on additional comparisons between a first instance of a received second signal, within the plurality of state transition signals, and a delayed second instance of the second signal, and the first signal and second signal are concurrent signals received over different line interfaces.

In one implementation, the negative hold time logic circuit may include a separate negative hold time logic device for each of the plurality of line interfaces, each separate negative hold time logic device adapted to concurrently sample a delayed instance of a distinct received signal, within the plurality of state transition signals, based on the clock signal and provide distinct symbol outputs.

In one example, the clock extraction circuit may include: (a) a comparator that compares the first instance of the first signal (SI) and the delayed instance of the first signal (SD) and outputs a comparison signal (NE); (b) a set-reset latch device that receives the comparison signal (NE) and outputs a filtered version of the comparison signal (NEFLT); and/or (c) a first analog delay device that delays the filtered version of the comparison signal (NEFLT) and outputs a delayed filtered version of the comparison signal (NEFLTD), where the delayed filtered version of the comparison signal (NEFLTD) serves to reset the set-reset latch device.

The negative hold time logic circuit may include a flip flop device that receives the delayed second instance of the first signal (SD) and outputs a symbol (S), where the flip flop device is triggered by the filtered version of the comparison signal (NEFLT).

Additionally, in some implementations, the receiver circuit may include a second analog delay device that delays the first instance of the first signal and outputs the delayed second instance of the first signal.

Additionally, in other implementations, the receiver circuit may include: (a) a latch device that captures the first instance of the first signal and outputs the delayed second instance of the first signal; and/or (b) a second analog delay device that delays the comparison signal (NE) and uses the delayed comparison signal (NED) to trigger the latch device.

In yet other implementations, the receiver circuit may include: (a) a latch device that captures the first instance of the first signal and outputs the delayed second instance of the first signal while either the filtered version of the comparison signal (NEFLT) or the delayed filtered version of the comparison signal (NEFLTD) is in a logical high state; and/or (b) an OR gate that receives as input the filtered version of the comparison signal (NEFLT) and the delayed filtered version of the comparison signal (NEFLTD) and outputs a signal used to trigger the latch device.

Additionally, a method operational on a receiver circuit may comprise: (a) receiving a spread signal distributed over the plurality of line interfaces, the spread signal carrying symbols with guaranteed symbol-to-symbol state transitions between consecutive symbols, the spread signal defined by a plurality of state transition signals including a first signal over a first line interface; (b) obtaining a clock signal based on a comparison between a first instance of the first signal and a delayed second instance of the first signal; and/or (c) sampling the delayed second instance of the first signal based on the clock signal to provide a symbol output. In various examples, the first signal may be a differential signal or a single-ended signal. In one example, the spread signal may be one of a N-factorial (N!) encoded signal, a three-phase encoded signal, and/or a N-phase encoded signal. In some implementations, the sampling of the delayed second instance of the first signal maybe done using a negative hold time logic circuit.

In one example, the method may further include generating the clock signal based on additional comparisons between a first instance of a received second signal, within the plurality of state transition signals, and a delayed second instance of the second signal, where the first signal and the second signal are concurrent signals received over different line interfaces.

In another example, the method may further include concurrently sampling a delayed instance of a plurality of distinct signals, within the plurality of state transition signals, based on the clock signal and provide distinct symbol outputs.

In some exemplary implementations, obtaining a clock signal may include: (a) comparing the first instance of the first signal (SI) and the delayed instance of the first signal (SD) to provide a comparison signal (NE); (b) latching the comparison signal (NE) to obtain a filtered version of the comparison signal (NEFLT); and/or (c) delaying the filtered version of the comparison signal (NEFLT) to provide a delayed filtered version of the comparison signal (NEFLTD), where the delayed filtered version of the comparison signal (NEFLTD) serves to latch the comparison signal (NE). In a first example, the method may further include delaying the first instance of the first signal to obtain the delayed second instance of the first signal. In a second example, the method may further include: (a) capturing the first instance of the first signal to obtain the delayed second instance of the first signal; and/or (b) delaying the comparison signal (NE) and using the delayed comparison signal (NED) to trigger the latching of the comparison signal (NE). In a third example, the method may further include capturing the first instance of the first signal to obtain the delayed second instance of the first signal while either the filtered version of the comparison signal (NEFLT) or the delayed filtered version of the comparison signal (NEFLTD) is in a logical high state.

DETAILED DESCRIPTION

Various aspects are now described with reference to the drawings. In the following description, for purposes of explanation, numerous specific details are set forth in order to provide a thorough understanding of one or more aspects. It may be evident, however, that such aspect(s) may be practiced without these specific details.

Certain aspects described herein may be applicable to communications links deployed between electronic devices that are subcomponents of a mobile apparatus such as a telephone, a mobile computing device, an appliance, automobile electronics, avionics systems, etc. Examples of a mobile apparatus include a cellular phone, a smart phone, a session initiation protocol (SIP) phone, a laptop, a notebook, a netbook, a smartbook, a personal digital assistant (PDA), a satellite radio, a global positioning system (GPS) device, a multimedia device, a video device, a digital audio player (e.g., MP3 player), a camera, a game console, a wearable computing device (e.g., a smartwatch, a health or fitness tracker, etc.), an appliance, a sensor, a vending machine, or any other similar functioning device.

Overview

Various clock recovery circuits are herein provided that implement jitter tolerance techniques with limited number of analog delays. In one example, a receiver circuit is adapted to receive a spread signal distributed over the plurality of line interfaces, the spread signal carrying symbols with guaranteed symbol-to-symbol state transitions between consecutive symbols. The spread signal defined by a plurality of state transition signals including a first signal over a first line interface. In some examples, the first signal may be a differential signal or a single-ended signal. While the first signal may be received spread over multiple line interfaces, it may be combined into a single signal carrying symbols with guaranteed state transitions from symbol to symbol. Due to the guaranteed state transitions, the first signal may also be referred to as a state transition signal.

A clock signal may then be extracted or obtained based on a comparison between a first instance of the first signal and a delayed second instance of the first signal. The delayed second instance of the first signal may be sampled based on the clock signal to provide a symbol output. Since the received first signal carries symbols with guaranteed symbol-to-symbol state transitions between consecutive symbols, these transitions are detected and used to generate the clock signal.

According to another feature, the clock signal may be further generated based on additional comparisons between a first instance of a received second signal, within the plurality of state transition signals, and a delayed second instance of the second signal, and the first signal and second signal are concurrent signals received over different line interfaces.

Exemplary Operating Environment(s)

Figure 1:
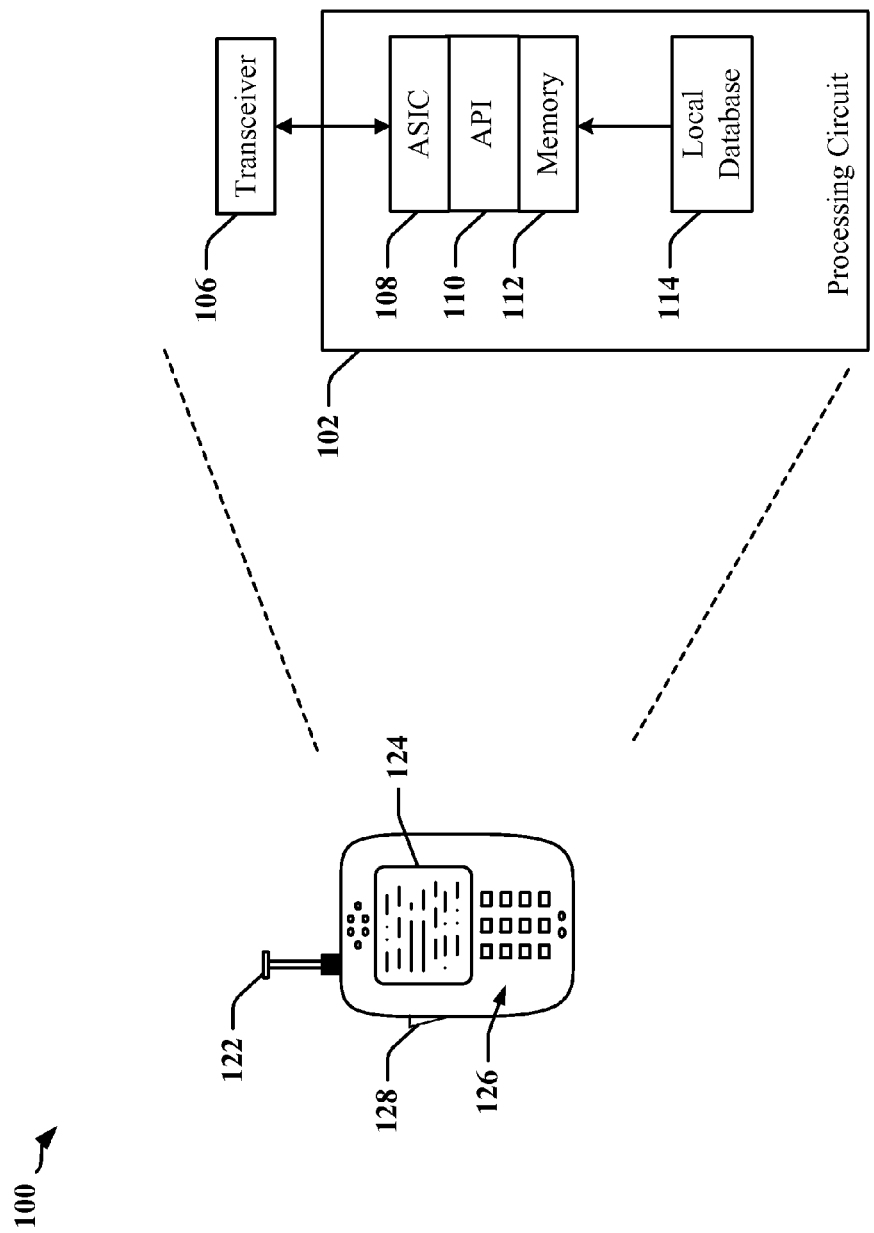
FIG. 1 depicts an apparatus that may employ a communication link between integrated circuit (IC) devices.

FIG. 1 depicts an apparatus that may employ a communication link between integrated circuit (IC) devices. In one example, the apparatus 100 may include a wireless communication device that communicates through a radio frequency (RF) transceiver with a radio access network (RAN), a core access network, the Internet and/or another network. The apparatus 100 may include a communications transceiver 106 operably coupled to processing circuit 102. The processing circuit 102 may include one or more IC devices, such as an application-specific IC (ASIC) 108. The ASIC 108 may include one or more processing devices, logic circuits, and so on. The processing circuit 102 may include and/or be coupled to processor readable storage such as a memory 112 that can maintain data and instructions that may be executed by processing circuit 102. The processing circuit 102 may be controlled by one or more of an operating system and an application programming interface (API) 110 layer that supports and enables execution of software modules residing in storage media, such as the memory device 112 of the wireless device. The memory device 112 may include read-only memory (ROM) or random-access memory (RAM), electrically erasable programmable ROM (EEPROM), flash cards, or any memory device that can be used in processing systems and computing platforms. The processing circuit 102 may include or access a local database 114 that can maintain operational parameters and other information used to configure and operate the apparatus 100. The local database 114 may be implemented using one or more of a database module, flash memory, magnetic media, EEPROM, optical media, tape, soft or hard disk, or the like. The processing circuit may also be operably coupled to external devices such as an antenna 122, a display 124, operator controls, such as button 128 and keypad 126 among other components.

One or more of the components illustrated in FIG. 1 may implement clock and data recovery, according to one or more aspects described herein, to recover a clock embedded within differential signal transitions in a multi-wire (N-Wire) communication system (e.g., N-factorial N! encoding, and N-phase encoding). Note that the terms "wires", "conductors", "connectors", and/or "lines" may be interchangeably used to refer to the electrical paths through which differential signals may be transmitted.

Figure 2:
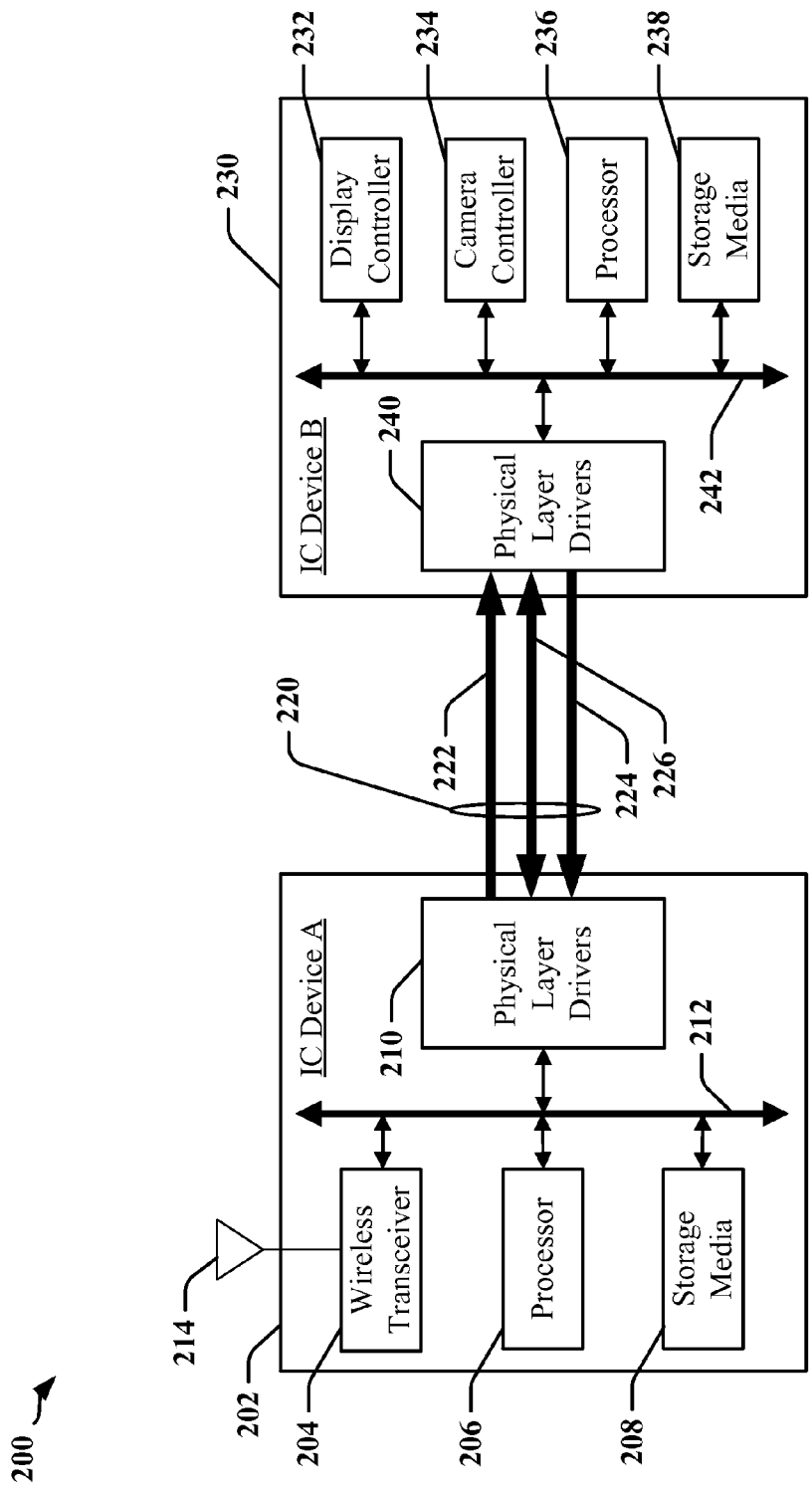
FIG. 2 illustrates a system architecture for an apparatus employing a data link between integrated circuit devices.

FIG. 2 is a block schematic 200 illustrating certain aspects of an apparatus 200 such as a mobile apparatus that employs a communication link 220 to connect various subcomponents. In one example, the apparatus 200 includes a plurality of IC devices 202 and 230 that exchange data and control information through a communication link 220. The communication link 220 may be used to connect IC devices 202 and 222 that are located in close proximity to one another, or physically located in different parts of the apparatus 200. In one example, the communication link 220 may be provided on a chip carrier, substrate or circuit board that carries the IC devices 202 and 230. In another example, a first IC device 202 may be located in a keypad section of a flip-phone while a second IC device 230 may be located in a display section of the flip-phone. In another example, a portion of the communication link 220 may include a cable or optical connection.

The communication link 220 may provide multiple channels 222, 224 and 226. One or more channels 226 may be bidirectional, and may operate in half-duplex and/or full-duplex modes. One or more channels 222 and 224 may be unidirectional. The communication link 220 may be asymmetrical, providing higher bandwidth in one direction. In one example described herein, a first communications channel 222 may be referred to as a forward link 222 while a second communications channel 224 may be referred to as a reverse link 224. The first IC device 202 may be designated as a host system or transmitter, while the second IC device 230 may be designated as a client system or receiver, even if both IC devices 202 and 230 are configured to transmit and receive on the communications link 222. In one example, the forward link 222 may operate at a higher data rate when communicating data from a first IC device 202 to a second IC device 230, while the reverse link 224 may operate at a lower data rate when communicating data from the second IC device 230 to the first IC device 202.

The IC devices 202 and 230 may each have a processor or other processing and/or computing circuit or device 206, 236. In one example, the first IC device 202 may perform core functions of the apparatus 200, including maintaining wireless communications through a wireless transceiver 204 and an antenna 214, while the second IC device 230 may support a user interface that manages or operates a display controller 232. In the example, the second IC device 230 may be adapted to control operations of a camera or video input device using a camera controller 234. Other features supported by one or more of the IC devices 202 and 230 may include a keyboard, a voice-recognition component, and other input or output devices. The display controller 232 may include circuits and software drivers that support displays such as a liquid crystal display (LCD) panel, touch-screen display, indicators and so on. The storage media 208 and 238 may include transitory and/or non-transitory storage devices adapted to maintain instructions and data used by respective processors 206 and 236, and/or other components of the IC devices 202 and 230. Communication between each processor 206, 236 and its corresponding storage media 208 and 238 and other modules and circuits may be facilitated by one or more bus 212 and 242, respectively.

The reverse link 224 may be operated in the same manner as the forward link 222, and the forward link 222 and reverse link 224 may be capable of transmitting at comparable speeds or at different speeds, where speed may be expressed as data transfer rate and/or clocking rates. The forward and reverse data rates may be substantially the same or differ by orders of magnitude, depending on the application. In some applications, a single bidirectional link 226 may support communications between the first IC device 202 and the second IC device 230. The forward link 222 and/or reverse link 224 may be configurable to operate in a bidirectional mode when, for example, the forward and reverse links 222 and 224 share the same physical connections and operate in a half-duplex manner. In one example, the communication link 220 may be operated to communicate control, command and other information between the first IC device 202 and the second IC device 230 in accordance with an industry or other standard.

In one example, forward and reverse links 222 and 224 may be configured or adapted to support a wide video graphics array (WVGA) 80 frames per second LCD driver IC without a frame buffer, delivering pixel data at 810 Mbps for display refresh. In another example, forward and reverse links 222 and 224 may be configured or adapted to enable communications between with dynamic random access memory (DRAM), such as double data rate synchronous dynamic random access memory (SDRAM). Encoding devices 210 and/or 230 can encode multiple bits per clock transition, and multiple sets of wires can be used to transmit and receive data from the SDRAM, control signals, address signals, and so on.

The forward and reverse links 222 and 224 may comply with, or be compatible with application-specific industry standards. In one example, the MIPI standard defines physical layer interfaces between an application processor IC device 202 and an IC device 230 that supports the camera or display in a mobile device. The MIPI standard includes specifications that govern the operational characteristics of products that comply with MIPI specifications for mobile devices. The MIPI standard may define interfaces that employ complementary metal-oxide-semiconductor (CMOS) parallel busses.

The communication link 220 of FIG. 2 may be implemented as a wired bus that includes a plurality of signal wires (denoted as N wires). The N wires may be configured to carry data encoded in symbols, where clock information is embedded in a sequence of the symbols transmitted over the plurality of wires. Examples of encoding techniques used with N-wire interfaces include N-factorial (N!) encoding, and N-phase encoding.

The IC devices 202 and/or 230 (and/or components therein) illustrated in FIG. 2 may implement clock and data recovery, according to one or more aspects described herein, to recover a clock embedded within differential signal transitions in a multi-wire (N-Wire) communication system (e.g., N-factorial N! encoding, and N-phase encoding).

Exemplary Encoding Techniques

Figure 3:
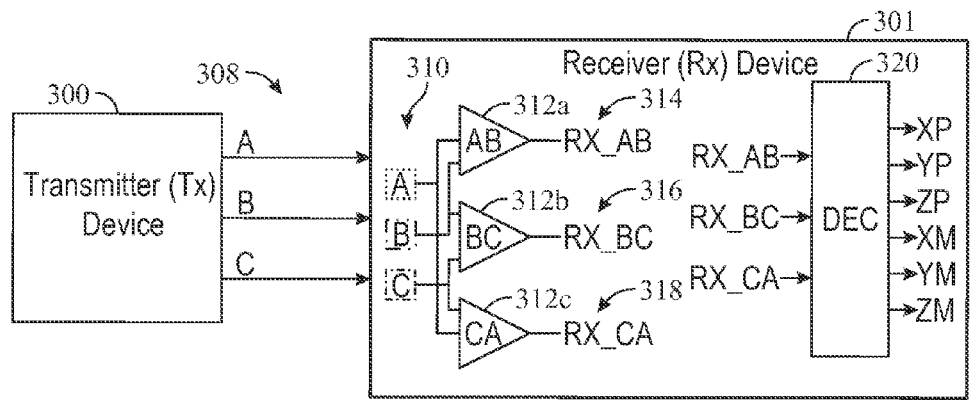
FIG. 3 illustrates a general 3-wire differential signaling scheme between a transmitter device and a receiver device based states defined by differential signals among a plurality of conductors A, B, and C.
Figure 3:
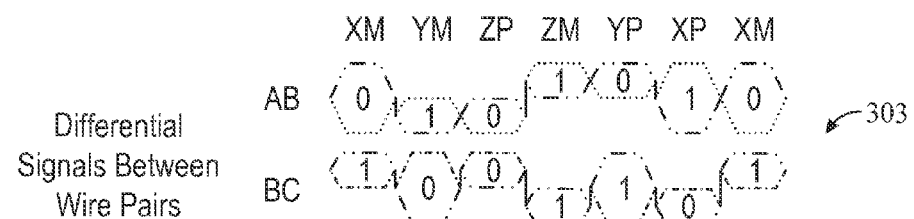
Figure 3:
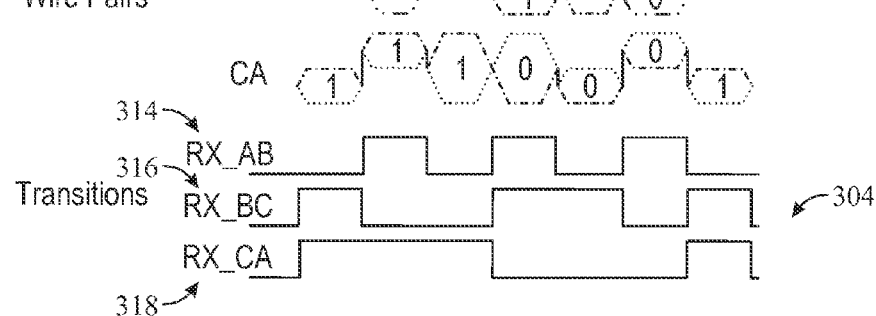
Figure 3:
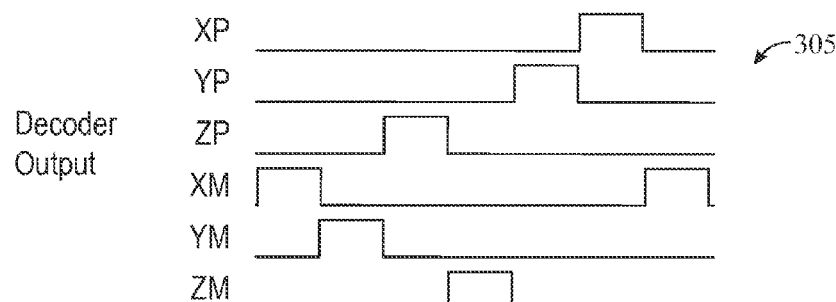

FIG. 3 illustrates a general 3-wire differential signaling scheme between a transmitter device 300 and a receiver device 301 based states defined by differential signals among a plurality of conductors/wires A, B, and C. The combinations of differential values (e.g., from 3 or more conductors) in a particular cycle may define a state or symbol. The transmitter device 300 and receiver device 301 may communicate over a multi-line bus 308. In this example, three lines A, B, and C are used for the bus 308. The receiver device 301 may include a three-port receiver 310 to couple the receiver device 301 to the bus 308.

A clock signal is embedded within this 3-wire differential signaling by guaranteeing that there is a symbol change every cycle. A clock data recovery circuit that extracts a clock signal from the differential signal must also minimize jitter. This clock signal may be used to synchronize decoding of the symbols in the 3-wire differential signal. While certain logic circuits may serve to minimize jitter, these require a relatively large number of logic devices, which is a problem when scaling up to n-wire differential signaling.

In one example, differential signal encoding may be used to transmit signals from the transmitter device 300 the receiver device 301. Consequently, each of a plurality of receivers 312 may be configured to take two of the three lines A, B, and C and provide a different signal. For instance, a first line A and a second line B may serve to provide a first differential signal RX_AB 314, the second line B and a third line C may serve to provide a second differential signal RX_BC 316, and the first line A and the third line C may serve to provide a third differential signal RX_CA 318. These differential signals 314, 316, and 318 may serve as inputs to a decoder circuit 320. The decoder circuit 320 decodes the three differential signals RX_AB 314, RX_BC 316, and RX_CA 318 and outputs the six states XM, YM, ZM, ZP, YP, and XP. In one example, each of the six states XM, YM, ZM, ZP, YP, and XP may represent a symbol, and the encoding used guarantees a symbol-to-symbol state transition for transmitted signals. The combination of differential signals RX_AB 314, RX_BC 316, and RX_CA 318 may be referred to a spread signal, where the spread signal carries the symbols. Due to their guaranteed state transitions, each of the differential signals RX_AB 314, RX_BC 316, and RX_CA 318 may be referred to as a state transition signal.

In this example, the receivers 312 are illustrated as differential receivers which take as inputs two signals from two different wires (e.g., AB, BC, AC) and output a differential signal (i.e., the output signal being the difference between the two input signals). In one example, the voltage difference between two wires/conductors may define a differential signal. In another example, the current flow direction in each wire/conductor may also be used (alone or in combination with voltage) define a differential signal.

A state diagram 303 illustrates the six (6) states XM, YM, ZM, ZP, YP, and XP that may be defined by the differential signals 314, 316, and 318 carried by the three conductors A, B, and C 308. As can be observed, the voltage levels across the three differential signals 314, 316, and 318 may be mapped to different combinations of ones (1) and zeros (0). For instance, the differential signal voltage levels for state XM may be associated with "011", state YM may be associated with "101", state ZP may be associated with "001", state ZM may be associated with "110", state YP may associated with "010", and state XP may be associated with "100".

In addition to the information encoded in the states (e.g., 3 bits per state), information may also be encoded based on transitions between the states. Note that transition between any two states (XM, YM, ZM, ZP, YP, and XP) occurs in a single step without traversing intermediate states. As such, differential data transmission schemes based on the state diagram 303 would be free of state transition decoding problems.

Each of the conductors of the bus 308 may be driven High, driven Low, or undriven, with only one conductor being undriven in any single cycle. In one embodiment, three differential signals, RX_AB 314, RX_BC 316, and RX_CA 318 (e.g., received by a decoder 320 within receiver device 301), are defined as positive differential voltage to logic 1 and negative differential voltage to logic 0 between conductor A relative to conductor B, conductor B relative to conductor C, and conductor C relative to conductor A respectively. Example waveforms of the three differential signals 314, 316, and 318 are illustrated in the diagram 304.

Six possible states (excluding the states that cause a zero differential voltage between conductor A relative to conductor B, conductor B relative to conductor C, and conductor C relative to conductor A) are defined as XM, YM, ZP, ZM, YP, XP, and XM by states of the signals RX_AB 314, RX_BC 316, and RX_CA 318 according to state diagram 303.

State signals corresponding to the six possible states XM, YM, ZP, ZM, YP, XP, and XM are generated from the differential signals RX_AB 314, RX_BC 316, and RX_CA 318 by a decoder block 320 (DEC), in the receiver device 301, and exemplary waveforms of the state signals are shown in the diagram 305.

In one embodiment, a state transition from a state, XM, YM, ZP, ZM, YP, XP, or XM, to a different state always occurs at any single cycle in a way that a state transition represents data to be transmitted from the transmitter device 300 to the receiver device 301.

In an alternative embodiment, single-ended signaling may be used over the conductors/wires A, B, C of the multi-line bus 308. In one example of single-ended signaling, one conductor/wire may carry a varying voltage that represents the signal while another conductor/wire may be connected to a reference voltage (e.g., ground). In the case of such single-ended signaling, the transmitter device 300 may include a plurality of single-ended open-drain (transistor) drivers, each driver coupled to a single wire/conductor A, B, C of the multi-line bus 308. The receiver device 301 may include one or more single-ended receivers (e.g., complementary metal-oxide-semiconductor (CMOS) transistors), where each single-ended receiver is coupled to a single wire/conductor A, B, C of the multi-line bus 308. The transmitter device 300 may receive input bits, encodes them into single-ended signals, and transmits the single-ended signals to the receiver device 301 through single-ended drivers via each wire/conductor A, B, C of the multi-line bus 308. The receiver device 301 receives the single-ended signals via each wire/conductor A, B, C of the multi-line bus 308 through the single-ended receivers, decodes the single-ended signals, and provides output bits. In this single-ended system, the decoder 320 may include a clock and data recovery (CDR) such that a clock signal is extracted from one or more received single-ended signals.

Figure 4:
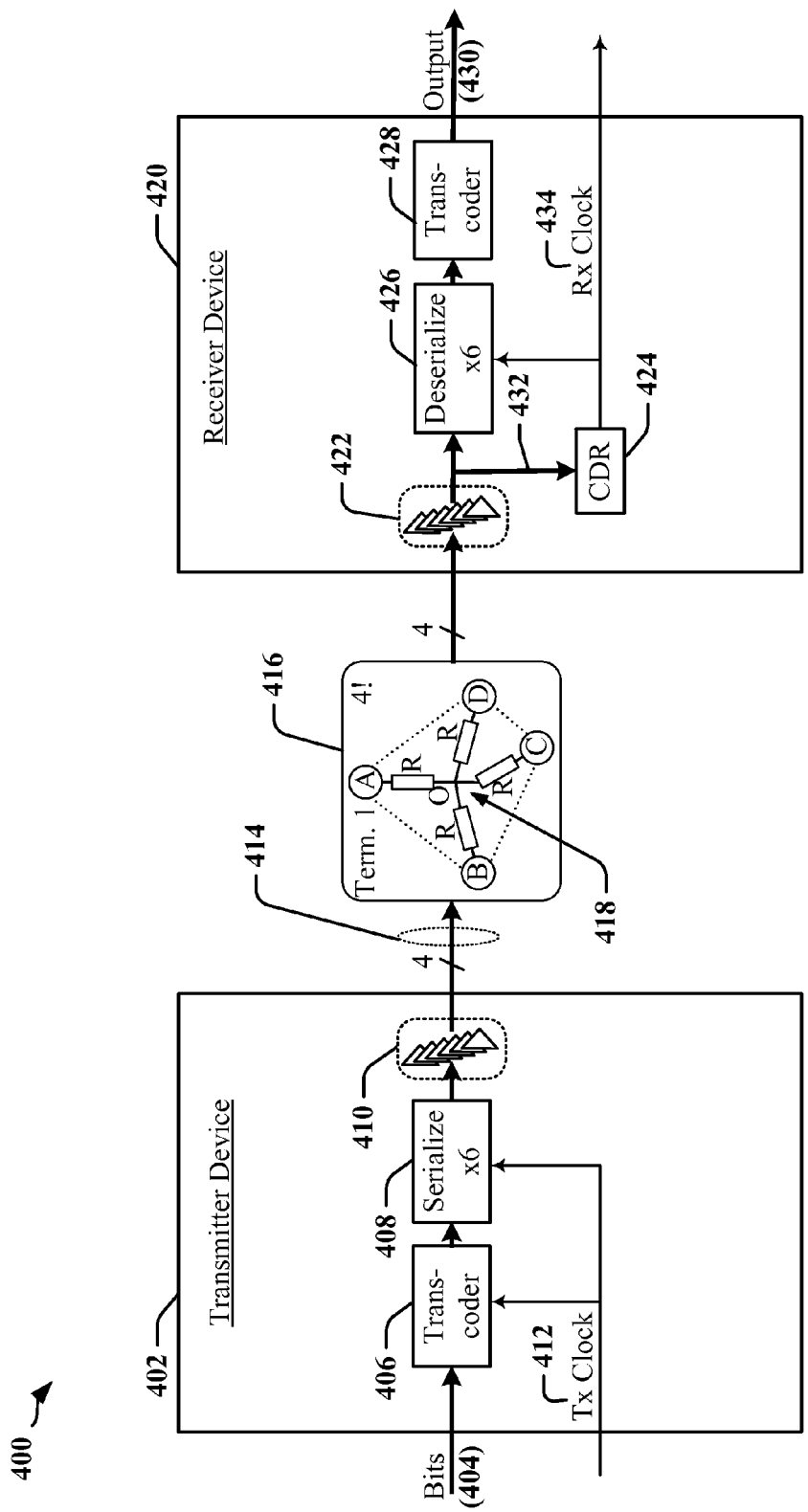
FIG. 4 illustrates an example of a basic N Factorial multi-wire interface.

FIG. 4 is a diagram illustrating an example of N-factorial (N!) encoding used on an N-wire interface 400 provided between two devices 402 and 420. At a transmitter 402, a transcoder 406 may be used to encode data 404 and clock information in symbols to be transmitted over a set of N wires 414. The clock information may be derived from a transmit clock 412 and may be encoded in a sequence of symbols transmitted in $_NC_2$ differential signals over the N wires 414 by ensuring that a signaling state transition occurs on at least one of the $_NC_2$ signals between consecutive symbols. When N! encoding is used to drive the N wires 414, each bit of a symbol is transmitted as a differential signal by one of a set of differential line drivers 410, where the differential drivers in the set of line drivers 410 are coupled to different pairs of the N wires. The number of available combinations of wire pairs ($_NC_2$) determines the number of signals that can be transmitted over the N wires 414. The number of data bits 404 that can be encoded in a symbol may be calculated based on the number of available signaling states available for each symbol transmission interval.

A termination impedance (typically resistive) couples each of the N wires 414 to a common center point 418 in a termination network 416. It will be appreciated that the signaling state of the N wires 414 reflects a combination of the currents in the termination network 416 attributed to the differential drivers 410 coupled to each wire. It will be further appreciated that the center point 418 is a null point, whereby the currents in the termination network 416 cancel each other at the center point.

The N! encoding scheme need not use a separate clock channel and/or non-return-to-zero decoding because at least one of the $_NC_2$ signals in the link transitions between consecutive symbols. Effectively, each transcoder 406 ensures that a transition occurs between each pair of symbols transmitted on the N wires 414 by producing a sequence of symbols in which each symbol is different from its immediate predecessor symbol. In the example depicted in FIG. 4, four wires are provided (N=4), and the 4 wires can carry $_4C_2=6$ differential signals. The transcoder 406 may employ a mapping scheme to generate raw symbols for transmission on the N wires 414. The transcoder 406 may map data bits 404 to a set of transition numbers. The transition numbers may be used to select raw symbols for transmission based on the value of the immediately preceding symbol such that the selected raw symbol is different from the preceding raw symbol. The raw symbols may be serialized by the serializer 408 to obtain a sequence of symbols for transmission over the N-wires 414. In one example, a transition number may be used to lookup a data value corresponding to the second of the consecutive raw symbols with reference to the first of the consecutive raw symbols. At the receiver 420, a transcoder 428 may employ a mapping to determine a transition number that characterizes a difference between a pair of consecutive raw symbols in a lookup table, for example. The transcoders 406, 428 operate on the basis that every consecutive pair of raw symbols includes two different symbols.

The transcoder 406 at the transmitter 402 may select between N!−1 available signaling states at every symbol transition. In one example, a 4! system provides 4!−1=23 signaling states for the next symbol to be transmitted at each symbol transition. The bit rate may be calculated as $\log_2$(available_states) per transmit clock cycle.

According to certain aspects disclosed herein, double data rate (DDR) signaling may be employed to increase the interface bandwidth by transmitting two symbols in each period of the transmit clock 412. Symbol transitions occur at both the rising edge and falling edge of the transmit clock in a system using double data rate (DDR) clocking. The total available states in the transmit clock cycle is $(N!-1)^2=(23)^2=529$ and the number of data bits 404 that can transmitted over two symbol may be calculated as $\log_2(529)=9.047$ bits.

A receiving device 420 receives the sequence of symbols using a set of line receivers 422 where each receiver in the set of line receivers 422 determines differences in signaling states on one pair of the N wires 414. Accordingly, $_NC_2$ receivers are used, where N represents the number of wires. The $_NC_2$ receivers 422 produce a corresponding number of raw symbols as outputs. In the depicted 4-wire example, the signals received on the 4 wires 414 are processed by 6 receivers ($_4C_2$=6) to produce a raw symbol signal 432 that is provided to a CDR 424 and deserializer 426. The raw symbol signal 432 is representative of the signaling state of the N wires 414, and the CDR 424 may process the raw symbol signal 432 to generate a receive clock signal 434 that can be used by the deserializer 426.

The receive clock signal 434 may be a DDR clock signal that can be used by external circuitry to process received data 430 provided by the transcoder 428. The transcoder 428 decodes a block of received symbols from the deserializer 426 by comparing each symbol to its immediate predecessor. The transcoder 428 produces output data 430 corresponding to the data 404, provided to the transmitter 402.

Certain other multi-wire interfaces use N-phase encoding to transmit data over a plurality of wires.

It should be noted that the system illustrated in FIG. 4 may also be implemented using single-ended signaling and single-ended drivers/receivers between the transmitter device 402 and the receiver device 420 in place of differential signaling and differential drivers 410 and differential receivers 422. When single-ended signaling and single-ended drivers/receivers are used between the transmitter device 402 and the receiver device 420, the termination network 416 illustrated in FIG. 4 can be excluded.

Figure 5:
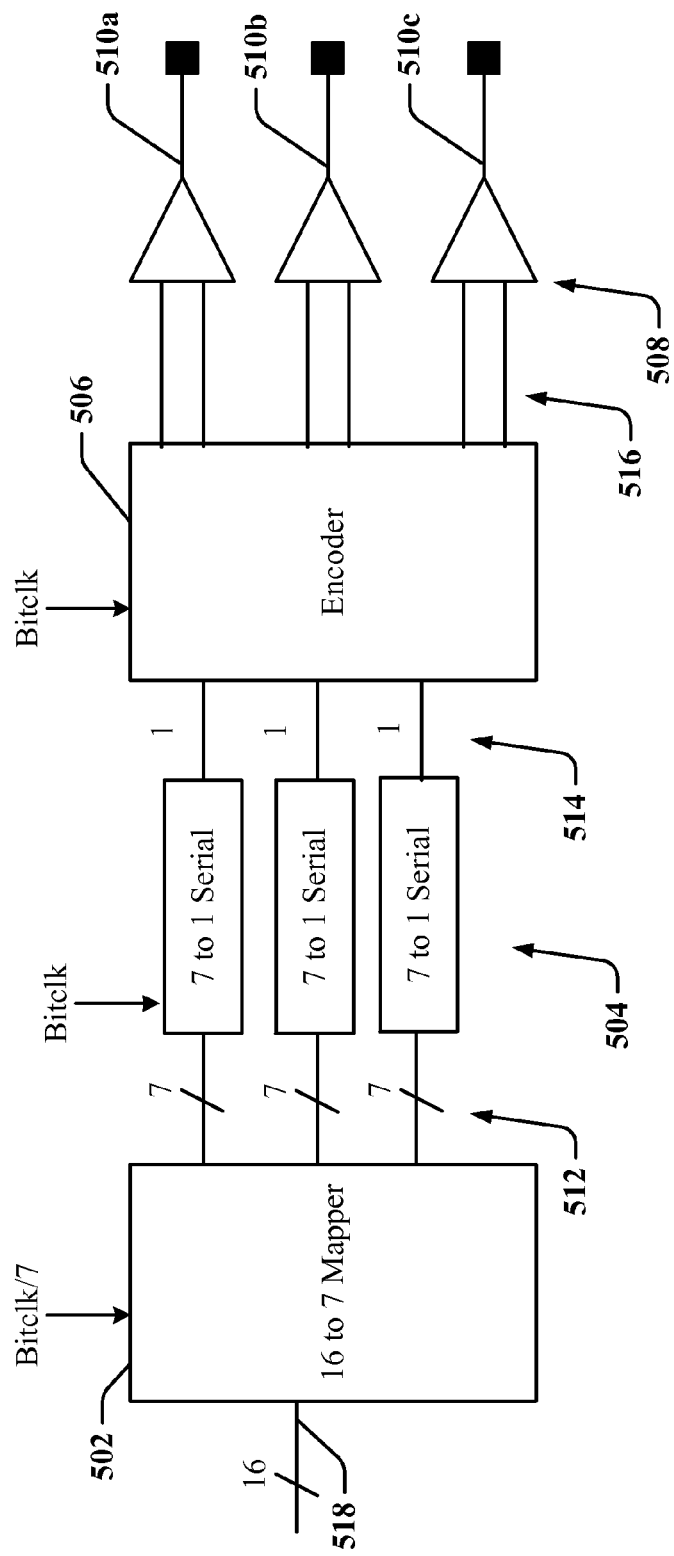
FIG. 5 illustrates an example of an M-wire, N-phase polarity encoding transmitter configured for M=3 and N=3.

FIG. 5 is a diagram 500 illustrating an example of an M-wire, N-phase polarity encoding transmitter configured for M=3 and N=3. The principles and techniques disclosed for 3-wire, 3-phase encoders can be applied in other configurations of M-wire, N-phase polarity encoders.

When N-phase polarity encoding is used, conductors such as signal wires 510a, 510b and 510c on an M-wire bus may be undriven, driven positive, or driven negative. An undriven signal wire 510a, 510b or 510c may be in a high-impedance state. An undriven signal wire 510a, 510b or 510c may be at least partially pulled or driven towards a voltage level that lies substantially halfway between the positive and negative voltage levels provided on driven signal wires. An undriven signal wire 510a, 510b or 510c may have no current flowing through it. In the example illustrated in FIG. 6, a set of drivers 508 (FIG. 5) may control the state of each signal wire 510a, 510b and 510c for each symbol transmission interval, such that each signal wire 510a, 510b and 510c may be in one of three states (denoted as +1, −1, and 0) for a transmitted symbol. In one example, drivers 508 may include unit-level current-mode drivers. In another example, drivers 508 may drive opposite polarity voltages on two signals 510a and 510b while the third signal 510c is at high impedance and/or pulled to ground. For each symbol transmission interval, at least one signal is in the undriven (0) state, while the number of signals driven positive (+1 state) is equal to the number of signals driven negative (−1 state), such that the sum of current flowing to the receiver is always zero. For each pair of consecutive symbol transmission intervals, at least one signal wire 510a, 510b or 510c has a different state in the two symbol transmission intervals.

In the example depicted in FIG. 5, 16-bit data 418 is input to a mapper 502, which maps the input data 518 to 7 symbols 512 for transmitting sequentially over the signal wires 510a, 510b and 510c. The 7 symbols 512 may be serialized, using parallel-to-serial converters 504 for example. A 3-wire, 3-phase encoder 406 receives 7 symbols 512 produced by the mapper one symbol at a time and computes the state of each signal wire 510a, 510b and 510c for each symbol interval. The encoder 506 selects the states of the signal wires 510a, 510b and 510c based on the input symbol and the previous states of signal wires 510a, 510b and 510c.

The use of M-wire, N-phase encoding permits a number of bits to be encoded in a plurality of symbols where the bits per symbol is not an integer. In the simple example of a 3-wire system, there are 3 available combinations of 2 wires that may be driven simultaneously, and 2 possible combinations of polarity on the pair of simultaneously driven wires, yielding 6 possible states. Since each transition occurs from a current state, 5 of the 6 states are available at every transition. The state of at least one wire is required to change at each transition. With 5 states, $\log_2(5) \cong 2.32$ bits may be encoded per symbol. Accordingly, a mapper may accept a 16-bit word and convert it to 7 symbols because 7 symbols carrying 2.32 bits per symbol can encode 16.24 bits. In other words, a combination of seven symbols that encodes five states has $5^7$ (78,125) permutations. Accordingly, the 7 symbols may be used to encode the $2^{16}$ (65,536) permutations of 16 bits.

Figure 6:
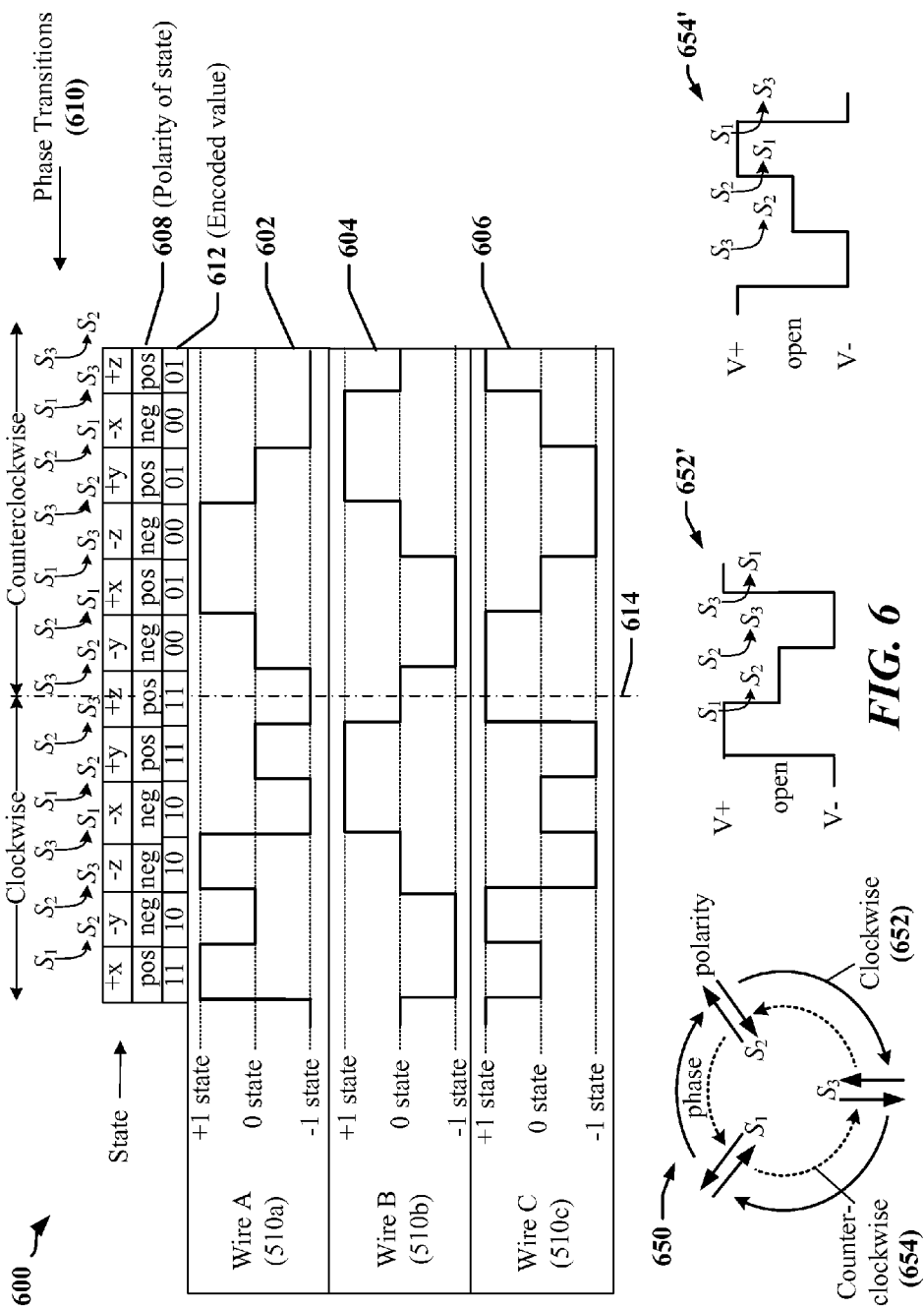
FIG. 6 illustrates an example of signaling employing a three-phase modulation data-encoding scheme based on the circular state transition diagram.

FIG. 6 illustrates an example of signaling 600 employing a three-phase modulation data-encoding scheme based on the circular state transition diagram 650. According to the data-encoding scheme, a three-phase signal may rotate in two directions and may be transmitted on three conductors 510a, 510b and 510c. Each of the three signals is independently driven on the conductors 510a, 510b, 510c. Each of the three signals includes the three-phase signal, with the signal on each conductor 510a, 510b and 510c being 120 degrees out of phase relative to the signals on the other two conductors 510a, 510b and 510c. At any point in time, each of the three conductors 510a, 510b, 510c is in a different one of the states {+1, 0, −1}. At any point in time, each of the three conductors 510a, 510b, 510c in a 3-wire system is in a different state than the other two wires. However, when more than three conductors or wires are used, two or more pairs of wires may be in the same state. The illustrated encoding scheme also encodes information in the polarity of the two conductors 510a, 510b and/or 510c that are actively driven to the +1 and −1 states. Polarity is indicated at 608 for the sequence of states depicted.

At any phase state in the illustrated three-wire example, exactly two of the conductors 510a, 510b, 510c carry a signal which is effectively a differential signal for that phase state, while the third conductor 510a, 510b or 510c is undriven. The phase state for each conductor 510a, 510b, 510c may be determined by voltage difference between the conductor 510a, 510b or 510c and at least one other conductor 510a, 510b and/or 510c, or by the direction of current flow, or lack of current flow, in the conductor 510a, 510b or 510c. As shown in the state transition diagram 550, three phase states ($S_1$, $S_2$ and $S_3$) are defined. A signal may flow clockwise from phase state $S_1$ to phase state $S_2$, phase state $S_2$ to phase state $S_3$, and/or phase state $S_3$ to phase state $S_1$ and the signal may flow counter-clockwise from phase state $S_1$ to phase state $S_3$, phase state $S_3$ to phase state $S_2$, and/or phase state $S_2$ to phase state $S_1$. For other values of N, transitions between the N states may optionally be defined according to a corresponding state diagram to obtain circular rotation between state transitions.

In the example of a three-wire, three-phase communications link, clockwise rotations ($S_1$ to $S_2$), ($S_2$ to $S_3$), and/or ($S_3$ to $S_1$) at a state transition may be used to encode a logic 1, while counter-clockwise rotations ($S_1$ to $S_3$), ($S_3$ to $S_2$), and/or ($S_2$ to $S_1$) at the state transition may be used to encode a logic 0. Accordingly a bit may be encoded at each transition by controlling whether the signal is "rotating" clockwise or counter-clockwise. For example, a logic 1 may be encoded when the three wires 510a, 510b, 510c transition from phase state $S_1$ to phase state $S_2$ and a logic 0 may be encoded when the three wires 510a, 510b, 510c transition from phase state $S_1$ to phase state $S_3$. In the simple three-wire example depicted, direction of rotation may be easily determined based on which of the three wires 510a, 510b, 510c is undriven before and after the transition.

Information may also be encoded in the polarity of the driven conductors 510a, 510b, 510c or direction of current flow between two conductors 510a, 510b, 510c. Signals 602, 604, and 606 illustrate voltage levels applied to conductors 510a, 510b, 510c, respectively at each phase state in a three-wire, three-phase link. At any time, a first conductor 510a, 510b, 510c is coupled to a positive voltage (+V, for example), a second conductor 510a, 510b, 510c is coupled to a negative voltage (−V, for example), while the third conductor 510a, 510b, 510c may be open-circuited or otherwise undriven. As such, one polarity encoding state may be determined by the current flow between the first and second conductors 510a, 510b, 510c or the voltage polarities of the first and second conductors 510a, 510b, 510c. In some embodiments, two bits of data may be encoded at each phase transition. A decoder may determine the direction of signal phase rotation to obtain the first bit, and the second bit may be determined based on the polarity difference between two of the signals 602, 604 and 606. The decoder having determined direction of rotation can determine the current phase state and the polarity of the voltage applied between the two active conductors 510a, 510b and/or 510c, or the direction of current flow through the two active conductors 510a, 510b and/or 510c.

In the example of the three-wire, three-phase link described herein, one bit of data may be encoded in the rotation, or phase change in the three-wire, three-phase link, and an additional bit may be encoded in the polarity of two driven wires. Certain embodiments, encode more than two bits in each transition of a three-wire, three-phase encoding system by allowing transition to any of the possible states from a current state. Given three rotational phases and two polarities for each phase, 6 states are defined, such that 5 states are available from any current state. Accordingly, there may be $\log_2(5) \cong 2.32$ bits per symbol (transition) and the mapper may accept a 16-bit word and convert it to 7 symbols.

Figure 7:
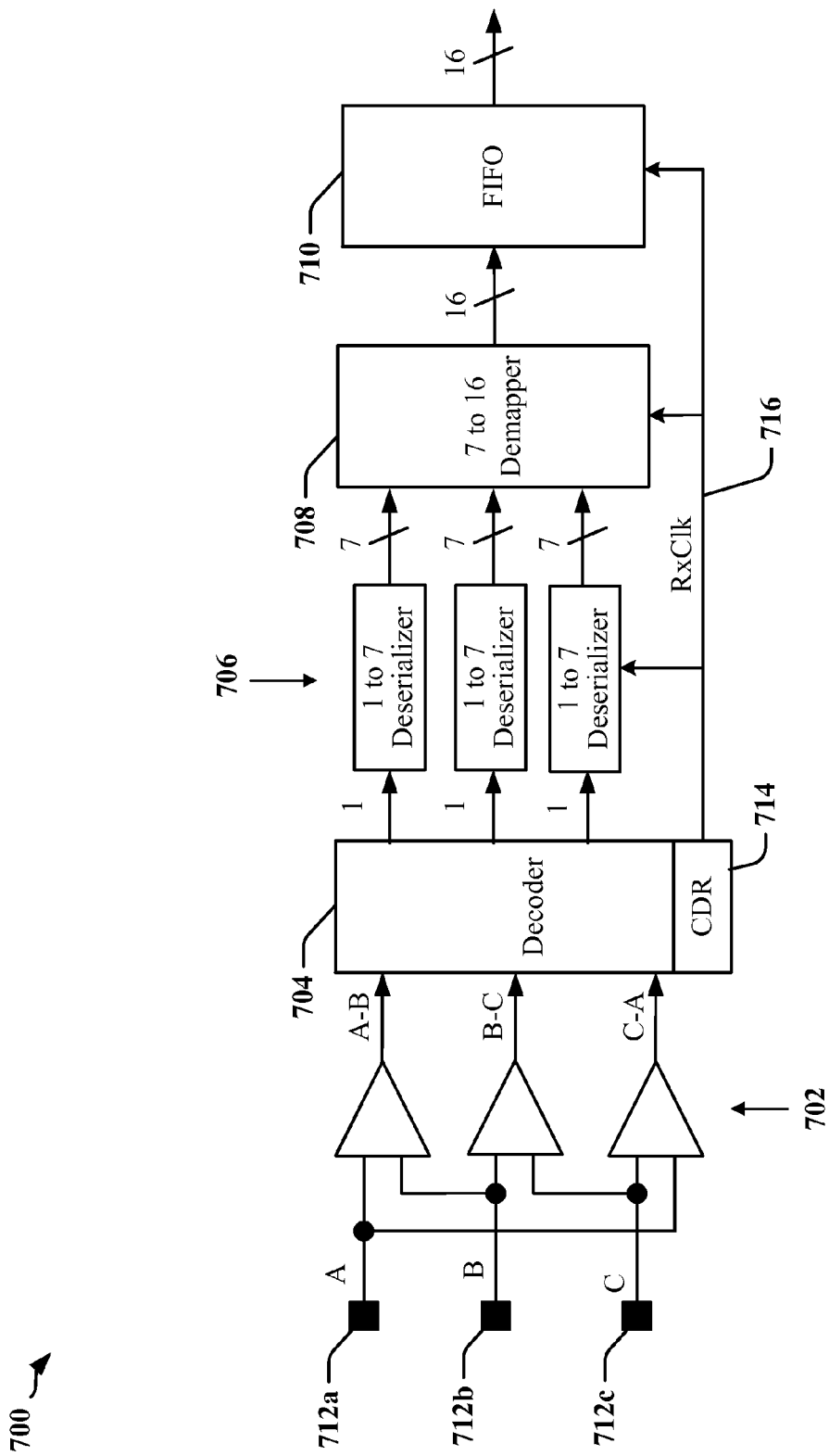
FIG. 7 is a block diagram illustrating an exemplary receiver in a 3-phase interface.

FIG. 7 is a block schematic drawing 700 illustrating an exemplary receiver in a 3-phase interface. A plurality of comparators 702 and a decoder 704 are configured to provide a digital representation of the state of each of three transmission lines or conductor 712a, 712b and 712c, as well as the change in the state of the three transmission lines compared to the state transmitted in the previous symbol period. As can be seen from the illustrated example, the voltage of each conductor 712a, 712b or 712c may be compared to the voltages of the other two conductor 712a, 712b and/or 712c to determine the state of each conductor 712a, 712b or 712c, such that the occurrence of a transition may be detected and decoded by the decoder 704 based on the outputs of the comparators 702. Seven consecutive states are assembled by serial to parallel converters or deserializers 706, which produce sets of 7 symbols to be processed by a demapper 708 to obtain 16 bits of data that may be buffered in a first in first out buffer (FIFO) 710. The decoder 704 may include a CDR circuit 714 configured to extract a receive clock 716 from transitions in signaling states between consecutive pairs of transmitted symbols.

TABLE 1

| | Wire amplitude | | | Diff. Rx output | | | Receiver Digital Output | | |
|---|---|---|---|---|---|---|---|---|---|
| State | A | B | C | A − B | B − C | C − A | Rx_AB | Rx_BC | Rx_CA |
| +x | +V | 0 | +V/2 | +V | −V/2 | −V/2 | 1 | 0 | 0 |
| −x | 0 | +V | +V/2 | −V | +V/2 | +V/2 | 0 | 1 | 1 |
| +y | +V/2 | +V | 0 | −V/2 | +V | −V/2 | 0 | 1 | 0 |
| −y | +V/2 | 0 | +V | +V/2 | −V | +V/2 | 1 | 0 | 1 |
| +z | 0 | +V/2 | +V | −V/2 | −V/2 | +V | 0 | 0 | 1 |
| −z | +V | +V/2 | 0 | +V/2 | +V/2 | −V | 1 | 1 | 0 |

Table 1 illustrates the operation of the differential receivers 702. In this example, the wire states may be encoded in the voltage amplitude on the three wires 712a, 712b and 712c such that the +1 state of a wire is represented as a voltage +V volts, the −1 state of the wire is represented as 0 volts and the undriven state is represented or approximated as +V/2 volts. In particular, Table 1 illustrates the outputs of the differential receivers 702 for each wire in the 3-wire 3-Phase Polarity encoding system. A receiver/decoder may be configured to output a code at the digital output of the receiver for each symbol decoded.

Certain N-wire interfaces may be adapted to provide increased bandwidth through the use of DDR clocking, whereby a new symbol is transmitted at both the rising and falling edges of a transmit clock. However, conventional CDR circuits may be unable to respond to DDR clocking and/or conventional CDR circuits may limit the maximum possible operation speed of an N! wire or N-phase interface.

First Exemplary Clock and Data Recovery Circuit

Figure 8:
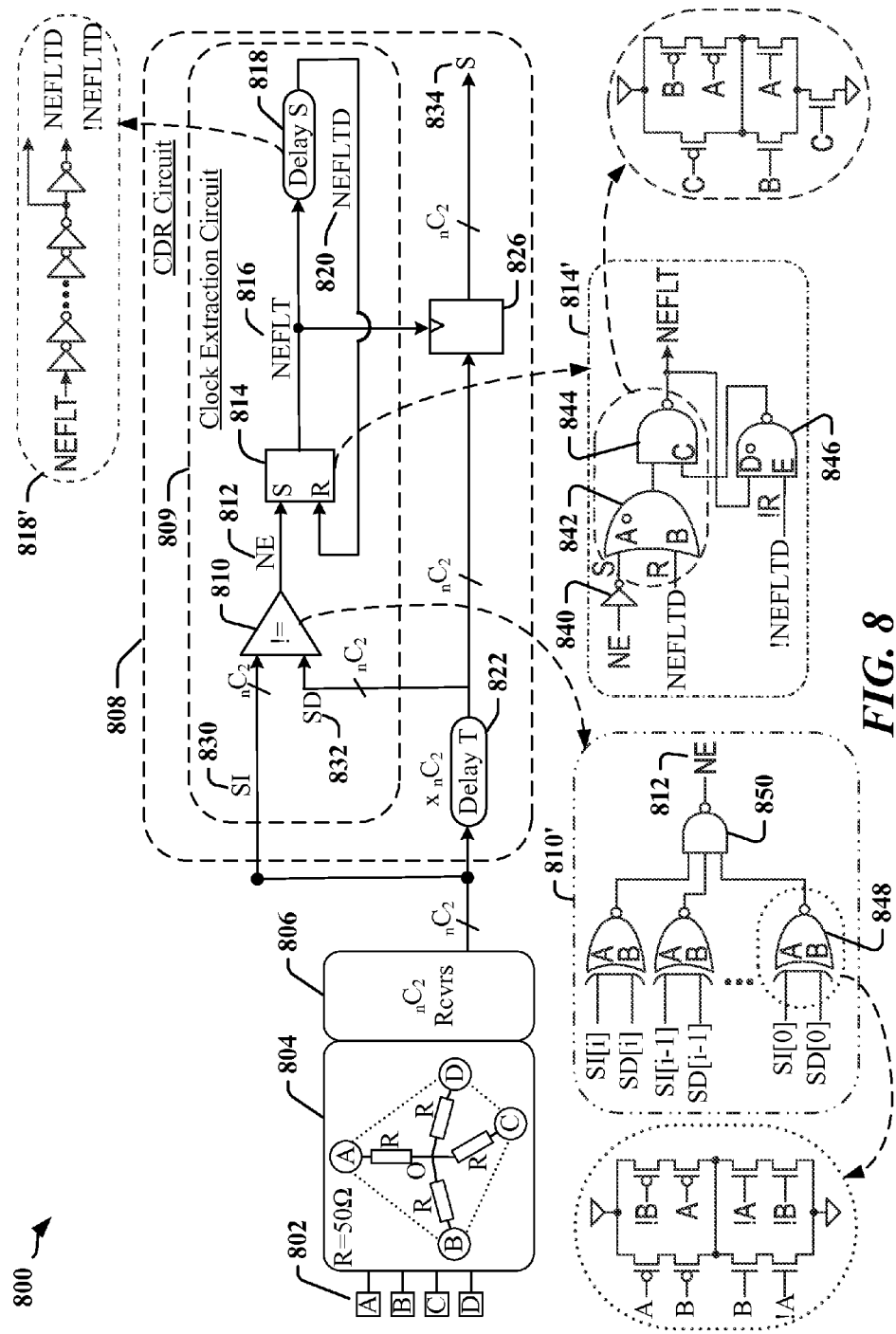
FIG. 8 is a schematic diagram including an exemplary CDR circuit that illustrates certain aspects of clock and data recovery from a multi-wire interface.

FIG. 8 is a schematic diagram 800 including an exemplary CDR circuit 808 that illustrates certain aspects of clock and data recovery from a multi-wire interface.

Figure 9:
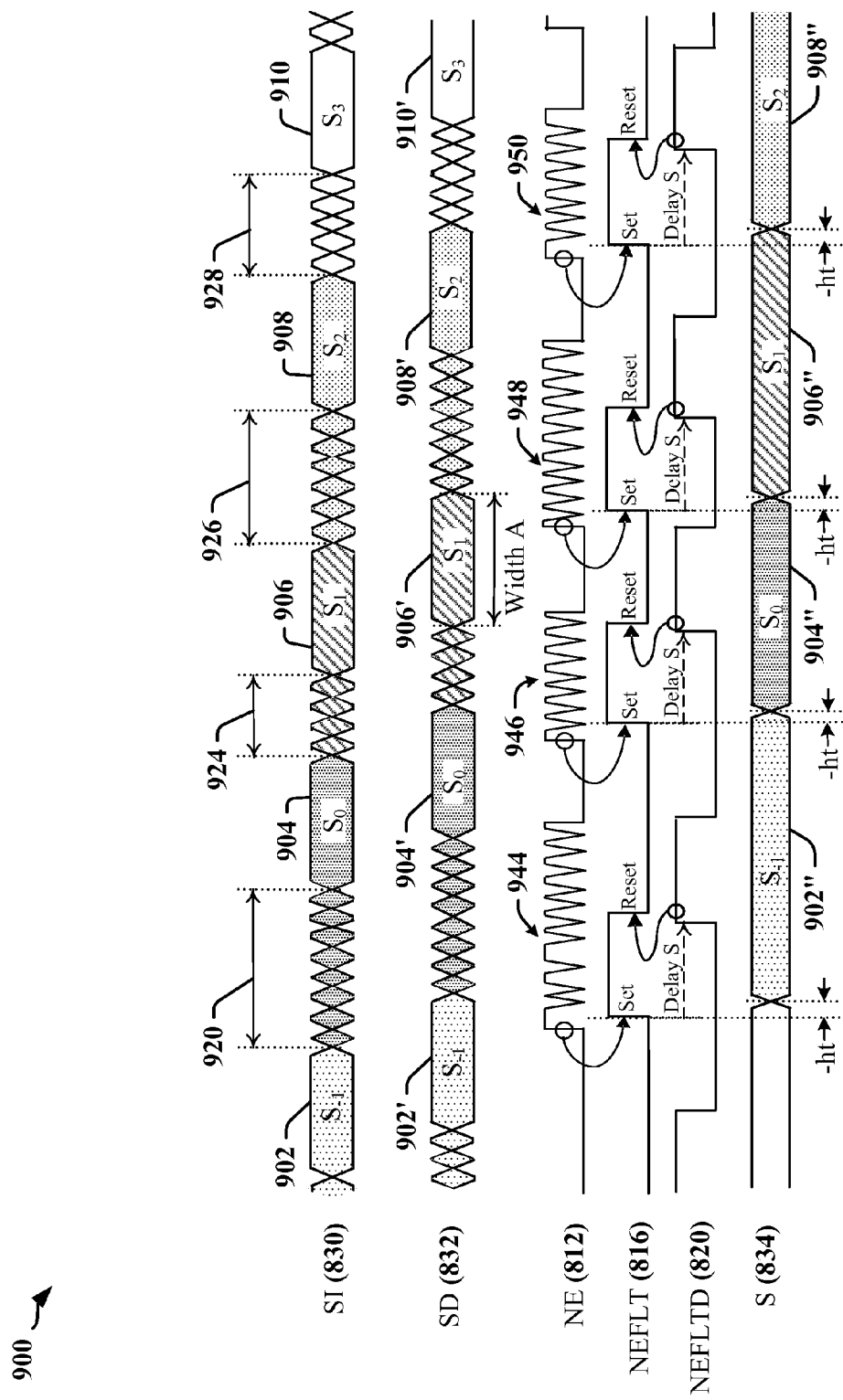
FIG. 9 illustrates an example of timing of certain signals generated by the CDR circuit.

FIG. 9 illustrates an example of timing of certain signals generated by the CDR circuit 808. The CDR circuit 808 may be used with a variety of multi-wire interfaces, including interfaces that use N! encoding, N-phase encoding, and other encoding schemes that use symbol transition clocking, including interfaces that employ single-ended multi-wire communication links.

A receiver circuit 800 may include a four-wire termination network 804, a plurality of receivers (Rcvrs) 806, and a clock and data recovery circuit 808. In one example, a clock is embedded in symbol transitions within a spread signal distributed across four wires or conductors 802. The CDR circuit 808 may be configured to extract a clock and data symbols from the spread signal received over the four wires or conductors 802. The spread signal may be defined by a plurality of transition signals including a first signal over a first line interface, conductor, or wire. The CDR circuit 808 may include a comparator 810, a set-reset latch 814, a first analog delay device S 818, and a second analog delay device T 822. A clock extraction circuit 809 may be defined by the comparator 810, a set-reset latch 814, and a first analog delay device S 818. The clock extraction circuit 809 may be adapted to extract a signal that may be used to obtain a clock signal from state transition in the received first signal. Since the spread signal carries symbols with guaranteed symbol-to-symbol state transitions between consecutive symbols, these transitions are detected and used to generate the clock signal. The clock signal may be obtained using jitter compensation and serves to sample symbols from the spread signal distributed over the plurality of receivers 806.

The comparator 810 may compare a first instance of the first signal (SI) 830 and a delayed second instance of the first signal (SD) 832 (i.e., delayed by the second analog delay device T 822), and the comparator 810 outputs a comparison signal (NE signal) 812. The set-reset latch 814 may receive the NE signal 812 from the comparator 810 and provides a filtered version of the comparison signal (NEFLT signal) 816. The first analog delay device S 818 receives the NEFLT signal 816 and outputs a delayed instance of the NEFLT signal 816 as the NEFLTD signal 820. The NEFLTD signal 820 serves as the reset input to the set-reset latch 814 such that the output of the set-reset latch 814 is reset after a delay S. In one example, the NEFLT signal 816 may be used as the clock signal to sample symbols.

The second analog delay device 822 may receive the first instance of the first signal (SI) 830 and provides a delayed second instance of the first signal (SD) 832 to the comparator 810. In one example, the spread signal distributed across the plurality of wires or conductors 802 and may include or is defined a plurality of distinct state transition signals which, when combined, carry symbols with guaranteed symbol-to-symbol state transitions between consecutive symbols. For example, for the case of three conductors using differential signaling in FIG. 3, spread signal may be defined by the combination of the differential signals RX_AB 314, RX_BC 316, or RX_CA 318. The first signal may be one of the differential signals RX_AB 314, RX_BC 316, or RX_CA 318. The first instance of the first signal (SI) 830 may comprise, for example, all or a portion/segment of any one of the differential signals RX_AB 314, RX_BC 316, or RX_CA 318.

A flip-flop device 826 may also receive the delayed second instance of the first signal (SD) 832 and outputs a symbol (S) 834 triggered by the NEFLT signal 816. That is, the flip-flop device 826 is triggered by a rising edge on the NEFLT signal 816. Consequently, the second analog delay device 822 serves to generate the NE signal 812. In turn, the NE signal 812 serves to generate the NEFLT signal 816 which serves as a latching clock for the flip-flop device 826.

In operation, when a transition occurs between a current symbol ($S_0$) 904 and a next symbol ($S_1$) 906, the state of the SI signal 830 begins to change. The NE signal 812 transitions high when the comparator 810 first detects a difference between the SI signal 830 and the SD signal 832, causing the set-reset latch 814 to be asynchronously set. Accordingly, the NEFLT signal 816 transitions high, and this high state is maintained until the set-reset latch 814 is reset when the NEFLTD signal 820 becomes high. The NEFLT signal 816 transitions to a high state in response to the rising edge of the NE signal 812, and the NEFLT signal 816 transitions to a low state in response to the rising edge of the NEFLTD signal 820 after a delay attributable to the first analog delay device S 818.

As transitions between symbols 902, 904, 906, 908, and 910 occur, one or more intermediate or indeterminate states 920, 924, 926, 928 may occur on the SI signal 830 due to inter-wire skew, signal overshoot, signal undershoot, crosstalk, and so on. The intermediate states on SI 830 may be regarded as invalid data, and these intermediate states may cause spikes 944, 946, 948, and 950 in the NE signal 812 as the output of the comparator 810 returns towards a low state for short periods of time. The spikes 944, 946, 948, and 950 do not affect the NEFLT signal 816 output by the set-reset latch 814. The set-reset latch 814 effectively blocks and/or filters out the spikes 944, 946, 948, and 950 on the NE signal 812 from the NEFLT signal 816.

The flip-flop device 826 may have a negative hold time (−ht) as the input symbols 902, 904, 906, 908, and 910 in the SI signal 830 can change prior to the symbol being latched or captured by the flip-flop device 826. For instance, each symbol 902', 904', 906' and 908' in the SD signal 832 is set or captured by the flip-flop device 826 at the rising clock edge of the NEFLT signal 816, which occurs after the input symbols 902, 904, 906, 908, and 910 have changed in the SI signal 830.

Various elements illustrated in the CDR circuit 808 may be implemented by various subcircuits. For example, the set-reset latch 814 may be implemented as a first logic circuit 814', the analog delay S device 818 may be implemented as a series of inverters 818', and the comparator 810 may be implemented as a second logic circuit 810'.

The first logic circuit 814' may include an inverter 840, an OR gate 842, a first NAND gate 844, and a second NAND gate 846.

The second logic circuit 810' may include a plurality of XNOR gates 848 whose outputs all serve as inputs to a NAND gate 850. The output of the NAND gate 850 may serve as the NE signal 812. Each input signal SI[x] into each of the XNOR gates 848 may correspond to a distinct state transition signal carrying part of the spread signal. For example, in the case of differential signaling of FIG. 3, the first signal SI[0] may be the first differential signal RX_AB 314, a second signal SI[1] may be the second differential signal RX_BC 316, and a third signal SI[2] may be the third differential signal RX_CA 318.

Figure 13:
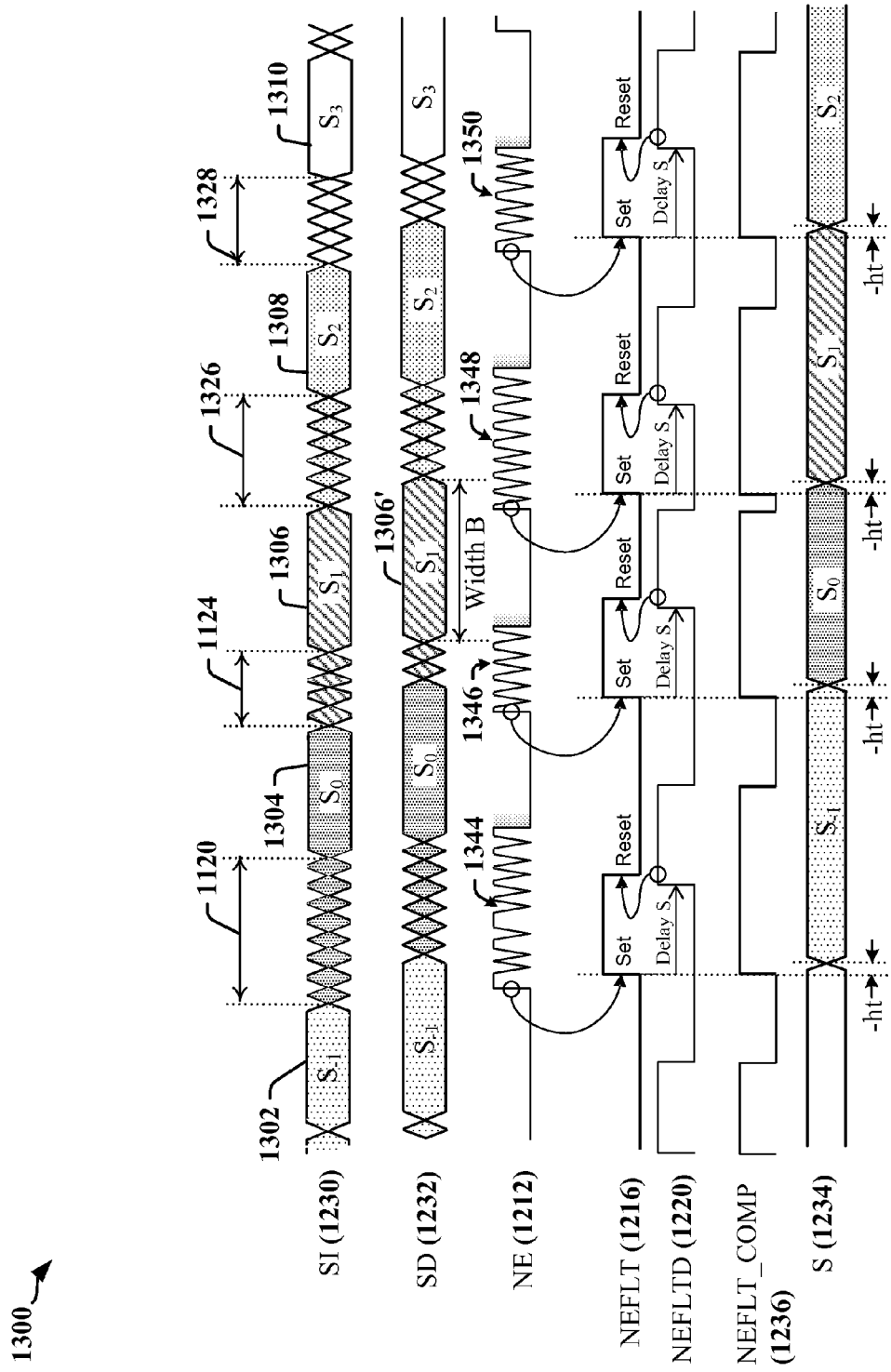
FIG. 13 is a timing diagram illustrating the operation of the CDR circuit under typical operating conditions.

While the CDR circuit 808 is tolerant to jitter, it is achieved using only $_nC_2$ analog delays and $2 \times {_nC_2}$ input comparators without the need for $2 \times {_nC_2}$ flip-flops, where $_nC_2$ is the number of available combinations of wire pairs ($_n$). For example, in U.S. Pat. No. 8,064,535, FIG. 13 illustrates a clock and data recovery circuit using $2 \times {_nC_2}$ flip-flops (i.e., twelve flip-flops for a combination of six wire pairs) and $_nC_2+1$ analog delays (i.e., seven analog delays for a combination of six wire pairs). Both flip-flops and analog delays are expensive resources to include in a CDR circuit, so minimizing their use is desirable. By comparison, in FIG. 8 the CDR circuit 808 may be implemented using $_nC_2+1$ analog delays 818 and 822 (i.e., seven analog delays for a combination of six wire pairs) and $_nC_2$ XNOR gates 848 (i.e., six comparator gates for a combination of six wire pairs).

Second Exemplary Clock and Data Recovery Circuit

Figure 10:
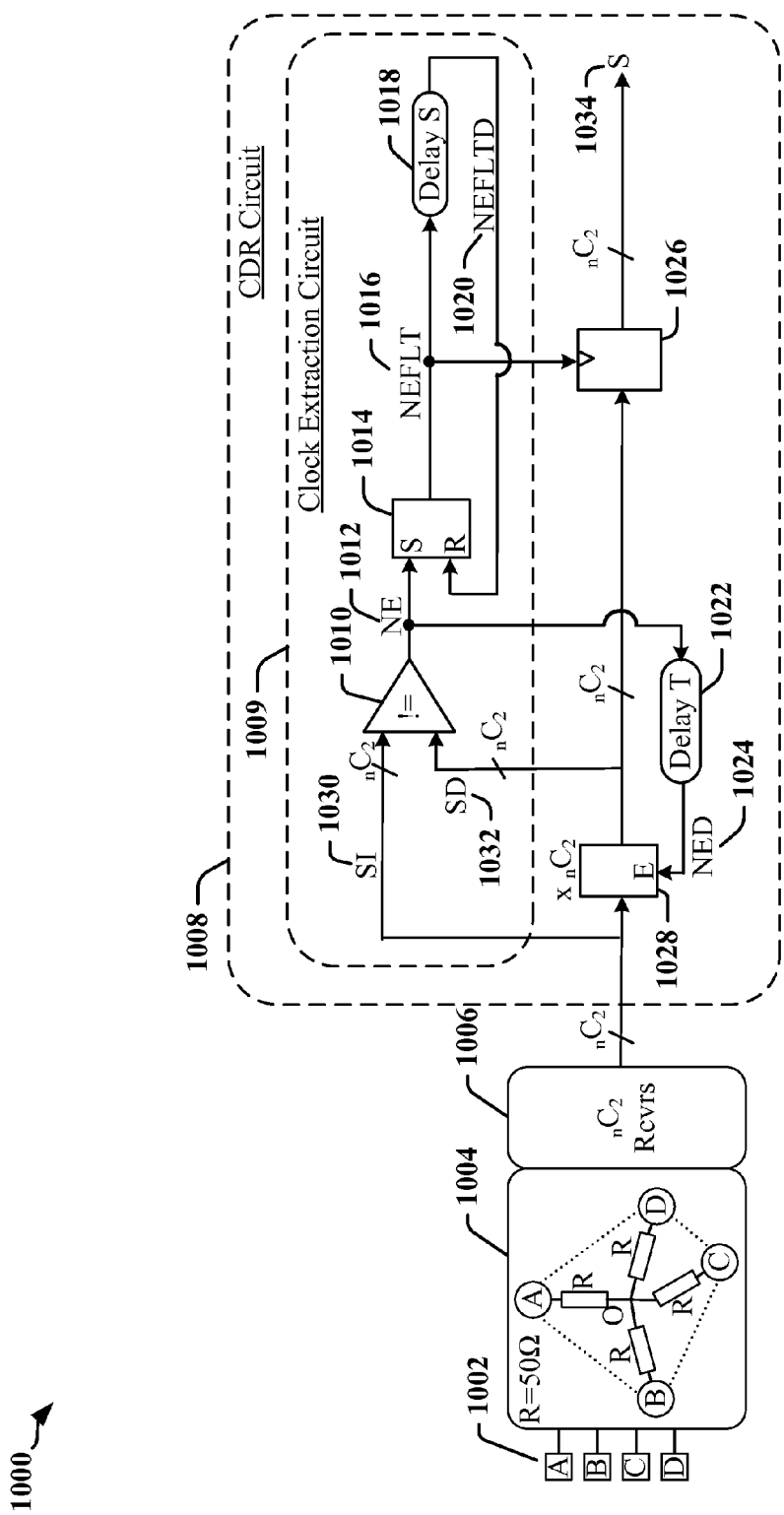
FIG. 10 is a block diagram including an exemplary CDR circuit that illustrates certain aspects of clock and data recovery from a multi-wire interface.

FIG. 10 is a block diagram 1000 including an exemplary CDR circuit 1008 that illustrates certain aspects of clock and data recovery from a multi-wire interface.

Figure 11:
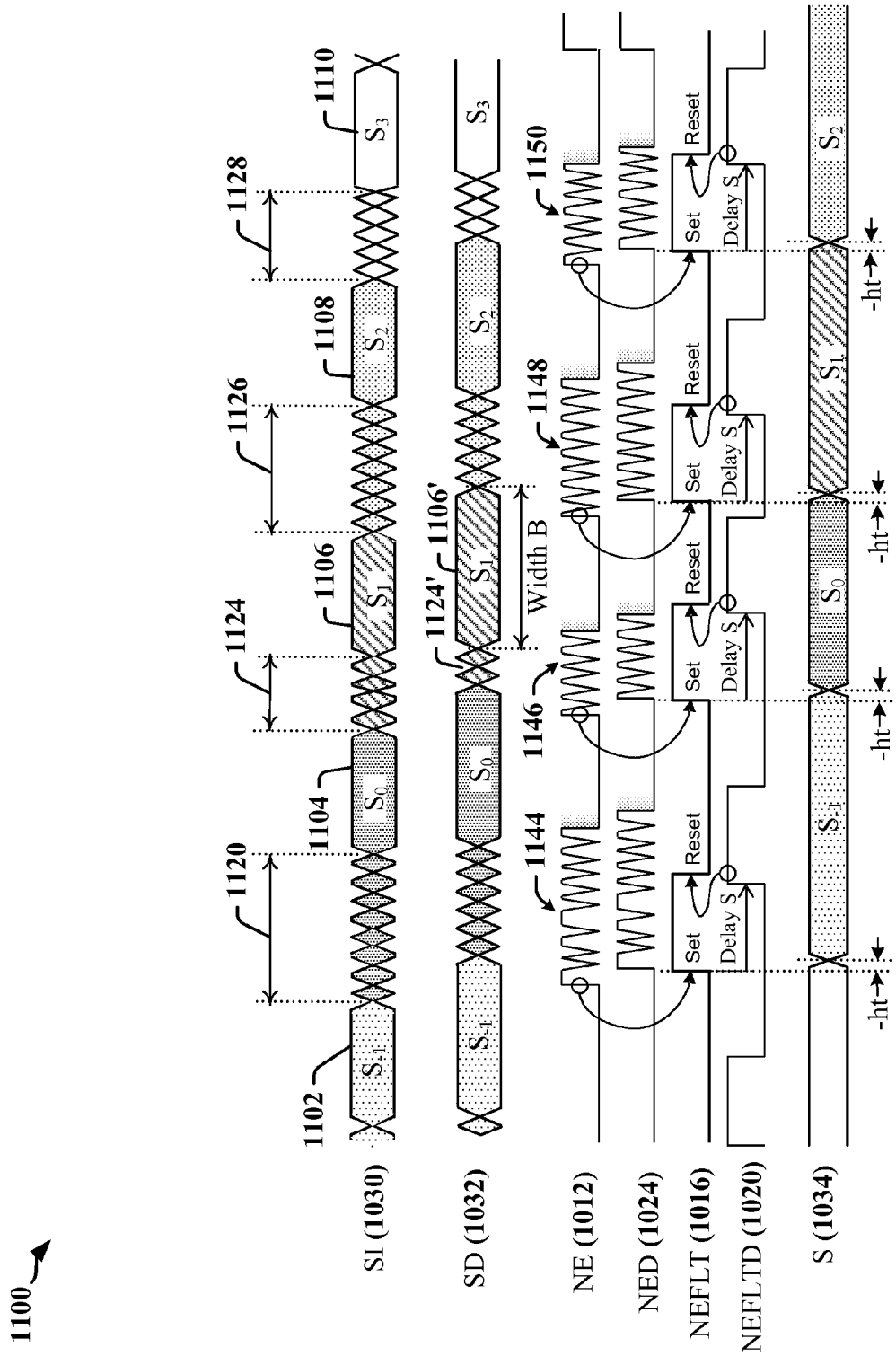
FIG. 11 is a timing diagram illustrating the operation of the CDR circuit under typical operating conditions.

FIG. 11 is a timing diagram 1100 illustrating the operation of the CDR circuit 1008 under typical operating conditions. The CDR circuit 1008 may be used with a variety of multi-wire interfaces, including interfaces that use N! encoding, N-phase encoding, and other encoding schemes that use symbol transition clocking, including interfaces that employ single-ended multi-wire communication links.

A receiver circuit 1000 may include a four-wire termination network 1004, a plurality of receivers 1006, and a clock data recovery circuit 1008. In one example, a clock is embedded in symbol transitions within a spread signal distributed across four wires or conductors 1002.

The CDR circuit 1008 may be configured to extract a clock and data symbols from the spread signal received over the four wires or conductors 1002. The spread signal may be defined by a plurality of transition signals including a first signal over a first line interface, conductor, or wire. The CDR circuit 1008 may include a comparator 1010, a set-reset latch 1014, a first analog delay device S 1018, a second analog delay device T 1022, and a level latch 1028. A clock extraction circuit 1009 may be defined by the comparator 1010, a set-reset latch 1014, and a first analog delay device S 1018. The clock extraction circuit 1009 may be adapted to extract a signal that may be used to obtain a clock signal from state transitions within the received first signal. Since the received spread signal carries symbols with guaranteed symbol-to-symbol state transitions between consecutive symbols, these transitions are detected and used to generate the clock signal. The clock signal may be obtained using jitter compensation and serves to sample symbols from the spread signal distributed over the plurality of receivers 1006.

The comparator 1010 may compare a first instance of the first signal (SI) 1030 and a delayed second instance of the first signal (SD) 1032, and the comparator 1010 outputs a comparison signal (NE signal) 1012. The set-reset latch 1014 may receive the NE signal 1012 from the comparator 1010 and provides a filtered version of the comparison signal (NEFLT signal) 1016. The first analog delay device S 1018 receives the NEFLT signal 1016 and outputs a delayed instance of the NEFLT signal 1016 as the NEFLTD signal 1020. The NEFLTD signal 1020 serves as the reset input to the set-reset latch 1014 such that the output of the set-reset latch 1014 is reset after a delay S. In one example, the NEFLT signal 1016 may be used as the clock signal to sample symbols.

Various elements illustrated in the CDR circuit 1008 may be implemented by various subcircuits. For example, the set-reset latch 1014 may be implemented as a first logic circuit 814' (FIG. 8), the analog delay S device 1018 may be implemented as a series of inverters 818', and the comparator 1010 may be implemented as a second logic circuit 810' (FIG. 8).

In one example, the spread signal distributed across the wires or conductors 1002 may include a plurality of distinct transition signals which, when combined, carry symbols with guaranteed symbol-to-symbol state transitions between consecutive symbols. For example, for the case of three conductors using differential signaling in FIG. 3, spread signal may be defined by the combination of the differential signals RX_AB 314, RX_BC 316, or RX_CA 318. The first signal may be one of the differential signals RX_AB 314, RX_BC 316, or RX_CA 318. The first instance of the first signal (SI) 830 may comprise, for example, all or a portion/segment of any one of the differential signals RX_AB 314, RX_BC 316, or RX_CA 318.

A level latch 1028 receives the first instance of the first signal (SI) 1030 and provides the delayed second instance of the first signal (SD) 1032 to the comparator 1010. The level latch 1028 is triggered by a delayed instance of the NE signal 1012. A flip-flop device 1026 may also receive the delayed second instance of the first signal (SD) 1032 and outputs a symbol (S) 1034 triggered by the NEFLT signal 1016. That is, the flip-flop device 1026 is triggered by a rising edge on the NEFLT signal 1016. Consequently, the level latch 1028 and second analog delay device 1022 serve to generate the NE signal 1012. In turn, the NE signal 1012 serves to generate the NEFLT signal 1016 which serves as a latching clock for the flip-flop device 1026.

In operation, when a transition occurs between a current symbol (S$_0$) 1104 and a next symbol (S$_1$) 1106, the state of the SI signal 1030 begins to change. The NE signal 1012 transitions high when the comparator 1010 first detects a difference between the SI signal 1030 and the SD signal 1032, causing the set-reset latch 1014 to be asynchronously set. Accordingly, the NEFLT signal 1016 transitions high, and this high state is maintained until the set-reset latch 1014 is reset when the NEFLTD signal 1020 becomes high. The NEFLT signal 1016 transitions to a high state in response to the rising edge of the NE signal 1012, and the NEFLT signal 1016 transitions to a low state in response to the rising edge of the NEFLTD signal 1020 after a delay attributable to the first analog delay device S 1018.

As transitions between symbols 1102, 1104, 1106, 1108, and 1110 occur, one or more intermediate or indeterminate states 1120, 1124, 1126, 1128 may occur on the SI signal 1030 due to inter-wire skew, signal overshoot, signal undershoot, crosstalk, and so on. The intermediate states on the SI signal 1030 may be regarded as invalid data, and these intermediate states may cause spikes 1144, 1146, 1148, and 1150 in the NE signal 1012 as the output of the comparator 1010 returns towards a low state for short periods of time. The spikes 1144, 1146, 1148, and 1150 do not affect the NEFLT signal 1016 output by the set-reset latch 1014. The set-reset latch 1014 effectively blocks and/or filters out the spikes 1144, 1146, 1148, and 1150 on the NE signal 1012 from the NEFLT signal 1016.

The flip-flop device 1026 may have a negative hold time (−ht) as the input symbols 1102, 1104, 1106, 1108, and 1110 in the SI signal 1030 can change prior to the symbol being latched or captured by the flip-flop device 1026. For instance, each symbol 1102', 1104', 1106' and 1108' in the SD signal 1032 is set or captured by the flip-flop device 1026 at the rising clock edge of the NEFLT signal 1016, which occurs after the input symbols 1102, 1104, 1106, 1108, and 1110 have changed in the SI signal 1030.

In comparison to the first CDR circuit 808 in FIG. 8, the second CDR circuit 1008 in FIG. 10 provides a wider and/or more stable symbols within the SD signal 1032. In particular, by triggering the level latch 1028 using a delayed version of the NE signal (signal NED 1024), a stable version of the delayed second instance of the first signal (SD signal 1032) can be latched in more quickly, resulting in a stable wider symbol. For example, in FIG. 9, a symbol S1 906' may have a width A in the SD signal 832 while in FIG. 11 the corresponding symbol S1 1106' may have a width B in the SD signal 1032, where width B>width A. Since the stable symbol portion of the SD signal 1032 is wider in this approach, this provides a wider sampling margin so a faster transmission link may be possible relative to the approach in FIGS. 8 and 9.

Relative to the CDR circuit in FIG. 13 of U.S. Pat. No. 8,064,535, which uses 2×$_n$C$_2$ flip-flops and $_n$C$_2$+1 analog delays, the CDR circuit 1008 of FIG. 10 is implemented using only two analog delays 1018 and 1022, $_n$C$_2$ level latches 1028, and $_n$C$_2$ XNOR gates 848. Generally, the level latches 1028 are less costly (in terms of resources) to implement than analog delays. Also, a level latch is less expensive than a flip-flop in terms of resources as a flip-flop takes two level latches to implement.

Third Exemplary Clock and Data Recovery Circuit

Figure 12:
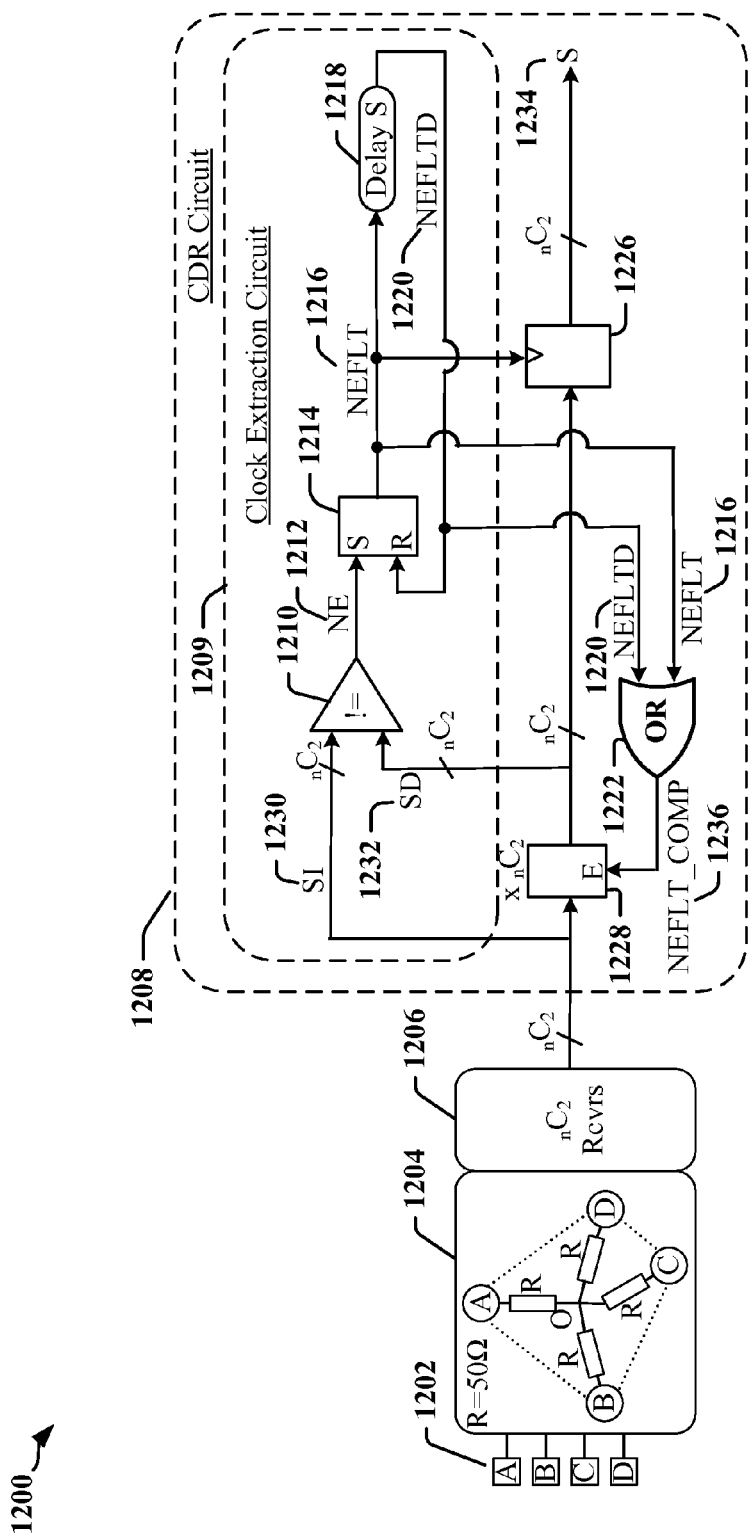
FIG. 12 is a block diagram including an exemplary CDR circuit that illustrates certain aspects of clock and data recovery from a multi-wire interface.

FIG. 12 is a block diagram 1200 including an exemplary CDR circuit 1208 that illustrates certain aspects of clock and data recovery from a multi-wire interface.

FIG. 13 is a timing diagram 1300 illustrating the operation of the CDR circuit 1208 under typical operating conditions. The CDR circuit 1208 may be used with a variety of multi-wire interfaces, including interfaces that use N! encoding, N-phase encoding, and other encoding schemes that use symbol transition clocking, including interfaces that employ single-ended multi-wire communication links.

A receiver circuit 1200 may include a four-wire termination network 1204, a plurality of receivers 1206, and a clock data recovery circuit 1208. In one example, a clock is embedded in symbol transitions within a spread signal received across four wires or conductors 1202. The spread signal may be defined by a plurality of transition signals including a first signal over a first line interface, conductor, or wire. The CDR circuit 1208 may be configured to extract a clock and data symbols from the spread signal received over the four wires or conductors 1202. The CDR circuit 1208 may include a comparator 1210, a set-reset latch 1214, a first analog delay device S 1218, and a level latch 1228. A clock extraction circuit 1209 may be defined by the comparator 1210, a set-reset latch 1214, and a first analog delay device S 1218. The clock extraction circuit 1209 may be adapted to extract a signal that may be used to obtain a clock signal from signals. The clock signal may be obtained using jitter compensation and serves to sample symbols from state transition in the spread signal received over the plurality of receivers 1206.

The comparator 1210 may compare a first instance of the first signal (SI) 1230 and a delayed second instance of the first signal (SD) 1232, and the comparator 1210 outputs a comparison signal (NE signal) 1212. The set-reset latch 1214 may receive the NE signal 1212 from the comparator 1210 and provides a filtered version of the comparison signal (NEFLT signal) 1216. The first analog delay device S 1218 receives the NEFLT signal 1216 and outputs a delayed instance of the NEFLT signal 1216 as the NEFLTD signal 1220. The NEFLTD signal 1220 serves as the reset input to the set-reset latch 1214 such that the output of the set-reset latch 1214 is reset after a delay S. In one example, the NEFLT signal 1216 may be used as the clock signal to sample symbols.

Various elements illustrated in the CDR circuit 1008 may be implemented by various subcircuits. For example, the set-reset latch 1214 may be implemented as a first logic circuit 814' (FIG. 8), the analog delay S device 1218 may be implemented as a series of inverters 818', and the comparator 1210 may be implemented as a second logic circuit 810' (FIG. 8).

In one example, the spread signal distributed across the wires or conductors 1202 may include a plurality of distinct transition signals which, when combined, carry symbols with guaranteed symbol-to-symbol state transitions between consecutive symbols. For example, for the case of three conductors using differential signaling in FIG. 3, spread signal may be defined by the combination of the differential signals RX_AB 314, RX_BC 316, or RX_CA 318. The first signal may be one of the differential signals RX_AB 314, RX_BC 316, or RX_CA 318. The first instance of the first signal (SI) 830 may comprise, for example, all or a portion/segment of any one of the differential signals RX_AB 314, RX_BC 316, or RX_CA 318.

A level latch 1228 receives the first instance of the first signal (SI) 1230 and provides the delayed second instance of the first signal (SD) 1232. The level latch 1228 is triggered by the resulting output NEFLT_COMP 1236 of an OR gate 1222 which has the NEFLT 1216 and NEFLTD signal 1220 as inputs.

A level latch 1228 receives the first instance of the first signal (SI) 1230 and provides the delayed second instance of the first signal (SD) 1232 to the comparator 1210. The level latch 1228 is triggered by a delayed instance of the NE signal 1212. A flip-flop device 1226 may also receive the delayed second instance of the first signal (SD) 1232 and outputs a symbol (S) 1234 triggered by the NEFLT signal 1216. That is, the flip-flop device 1226 is triggered by a rising edge on the NEFLT signal 1216. Consequently, the level latch 1228 serves to generate the NE signal 1212. In turn, the NE signal 1212 serves to generate the NEFLT signal 1216 which serves as a latching clock for the flip-flop device 1226.

In operation, when a transition occurs between a current symbol ($S_0$) 1304 and a next symbol ($S_1$) 1306, the state of the SI signal 1230 begins to change. The NE signal 1212 transitions high when the comparator 1210 first detects a difference between the SI signal 1230 and the SD signal 1232, causing the set-reset latch 1214 to be asynchronously set. Accordingly, the NEFLT signal 1216 transitions high, and this high state is maintained until the set-reset latch 1214 is reset when the NEFLTD signal 1220 becomes high. The NEFLT signal 1216 transitions to a high state in response to the rising edge of the NE signal 1212, and the NEFLT signal 1216 transitions to a low state in response to the rising edge of the NEFLTD signal 1220 after a delay attributable to the first analog delay device S 1218.

As transitions between symbols 1302, 1304, 1306, 1308, and 1310 occur, one or more intermediate or indeterminate states 1320, 1324, 1326, 1328 may occur on the SI signal 1230 due to inter-wire skew, signal overshoot, signal undershoot, crosstalk, and so on. The intermediate states on the SI signal 1230 may be regarded as invalid data, and these intermediate states may cause spikes 1344, 1346, 1348, and 1350 in the NE signal 1212 as the output of the comparator 1210 returns towards a low state for short periods of time. The spikes 1344, 1346, 1348, and 1350 do not affect the NEFLT signal 1216 output by the set-reset latch 1214. The set-reset latch 1214 effectively blocks and/or filters out the spikes 1344, 1346, 1348, and 1350 on the NE signal 1212 from the NEFLT signal 1216.

The flip-flop device 1226 may have a negative hold time (−ht) as the input symbols 1302, 1304, 1306, 1308, and 1310 in the SI signal 1230 can change prior to the symbol being latched or captured by the flip-flop device 1226. For instance, each symbol 1302', 1304', 1306' and 1308' in the SD signal 1232 is set or captured by the flip-flop device 1226 at the rising clock edge of the NEFLT signal 1216, which occurs after the input symbols 1302, 1304, 1306, 1308, and 1310 have changed in the SI signal 1230.

In comparison to the first CDR circuit 808 in FIG. 8 and the second CDR circuit 1008 in FIG. 10, this third CDR circuit 1208 is implemented without the second analog delay device T while still providing wider or more stable symbols within the SD signal 1232 in relation to the approaches in FIG. 8 and FIG. 10. The CDR circuit 1208 of FIG. 12 is a way to achieve minimum delay while guaranteeing to sample valid data in order to output symbol (S) 1234. Note that the CDR circuit 1008 of FIG. 10 has no way to make the delay T (i.e., second analog delay device T 1022) as small as the delay (i.e., the delay caused by the OR gate 1222) in FIG. 12 since delay T in FIG. 10 must have a safety margin to account for delay variations due to variations in manufacturing processes, electrical path lengths, temperature, etc.

In particular, by triggering the level latch 1228 using a delayed version of the NE signal (signal NEFLT_COMP 1236), a stable version of the delayed second instance of the first signal (SD signal 1232) can be latched in more quickly, resulting in a stable wider symbol. For example, in FIG. 9, a symbol S1 906' may have a width A in the SD signal 832 while in FIG. 13 the corresponding symbol S1 1306' may have a width B in the SD signal 1232, where width B>width A. Since the stable symbol portion of the SD signal 1232 is wider in this approach, this provides a wider sampling margin so a faster transmission link may be possible relative to the approach in FIGS. 8 and 9.

Relative to the CDR circuit in FIG. 13 of U.S. Pat. No. 8,064,535, which uses $2 \times {}_nC_2$ flip-flops and ${}_nC_2+1$ analog delays, the CDR circuit 1208 of FIG. 12 is implemented using only one analog delay 1218, ${}_nC_2$ level latches 1228, and ${}_nC_2$ XNOR gates 848. Generally, the level latches 1228 are less costly (in terms of resources) to implement than analog delays.

Exemplary General Clock and Data Recovery Circuit

Figure 14:
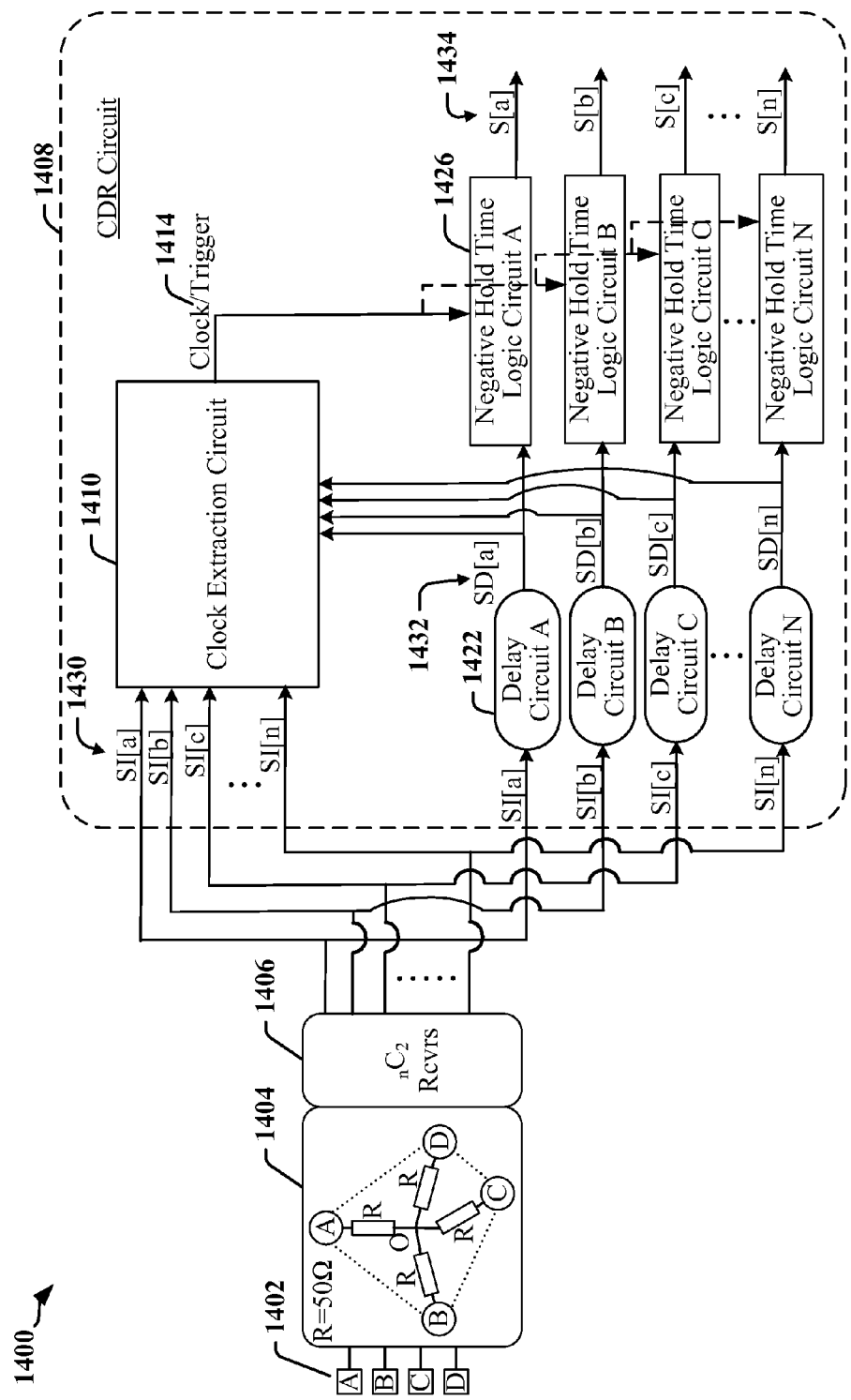
FIG. 14 is a schematic diagram including an exemplary CDR circuit that illustrates certain aspects of clock and data recovery from a multi-wire interface.

FIG. 14 is a schematic diagram 1400 including an exemplary CDR circuit 1408 that illustrates certain aspects of clock and data recovery from a multi-wire interface. The CDR circuit 1408 may be used with a variety of multi-wire interfaces, including interfaces that carry differential signals and/or single-ended signals. In various examples, a N-factorial (N!) encoded signal, a three-phase encoded signal, and/or an N-phase encoded signal by be received over the multi-wire interface. Additionally, other encoding schemes that use symbol transition clocking may also be used to transmit signals over the multi-wire interface.

A receiver circuit 1400 may include a four-wire termination network 1404, a plurality of receivers 1406 and a clock and data recovery circuit 1408. In one example, the receivers 1406 may be differential receivers (e.g., whose output is the difference between two input signals). In another example, the receivers 1406 may be single-ended receivers (e.g., whose output is its input signal relative to a reference, such as ground). When single-ended receivers are used, the termination network 1404 may be excluded.

In one example, a clock is embedded in symbol transitions across four wires or conductors 1402. The CDR circuit 1408 may be configured to extract a clock and data symbols from signals received over the four wires or conductors 1402.

A plurality of line interfaces (e.g., defined by the plurality of receivers 1406) may be configured to receive a spread signal distributed over the plurality of line interfaces, the spread signal carrying symbols with guaranteed symbol-to-symbol state transitions between consecutive symbols. The spread signal may be defined by a plurality of transition signals including a first signal over a first line interface. In one example, the first signal may be a differential signal or a single-ended signal. The spread signal may be one of a N-factorial (N!) encoded signal, a three-phase encoded signal, and/or a N-phase encoded signal.

The CDR circuit 1408 may include a clock extraction circuit 1410, a delay circuit 1422, and a negative hold time logic circuit 1426. The clock extraction circuit 1410 may be adapted to obtain a clock signal from state transitions within the spread signal. The clock signal may be obtained using jitter compensation and serves to sample symbols from the received spread signal distributed over the plurality of receivers 1406. For example, the clock signal may be based on a comparison between a first instance of a first signal SI[a] 1430 and a delayed second instance of the first signal SD[a] 1432. Since the spread signal carries symbols with guaranteed symbol-to-symbol state transitions between consecutive symbols, these transitions are detected and used to generate the clock signal. Note that the delayed second instance of the first signal SD[a] 1432 may be obtained by a delay circuit 1422 (e.g., delay device T 822 in FIG. 8, the second analog delay device T 1022 and the level latch 1028 in FIG. 10, and/or the OR gate 1222 and the level latch 1228 in FIG. 12).

Various examples of the clock extraction circuit 1410 are found in FIGS. 8, 10, and 11, where the NEFLT signal 816, 1016, and/or 1216 may serve as a clock signal.

The clock extraction circuit 1410 may be adapted to generate a clock signal based on a comparison between a first instance of a first signal SI[a] 1430 and a delayed second instance of the first signal SD[a] 1432. For instance, an NEFLT signal 816, 1016, and/or 1216 is generated in FIGS. 8, 10, and 12 and may serve as a sampling clock signal for symbol extraction.

In one example, the spread signal is distributed across the wires or conductors 1002 and may include a plurality of distinct transition signals which, when combined, carry symbols with guaranteed symbol-to-symbol state transitions between consecutive symbols. For example, for the case of three conductors using differential signaling in FIG. 3, the first signal may be defined by the combination of the differential signals RX_AB 314, RX_BC 316, and RX_CA 318. The first instance of the first signal (SI) 830 may comprise, for example, any one of the differential signals RX_AB 314, RX_BC 316, or RX_CA 318.

In one implementation, the clock extraction circuit 1410 may be further adapted to generate the clock signal 1414 based on additional comparisons between a first instance of a second signal SI[b], within the plurality of state transition signals, and a delayed second instance of the second signal SD[b], and the first signal SI[a] and second signal SI[b] may be concurrent signals received over different line interfaces (plurality of receivers 1406).

A negative hold time logic circuit 1426 may be adapted to sample the delayed second instance of the first signal SD[a] 1432 based on the clock signal and provide a symbol output S[a] 1434. In one implementation, the negative hold time logic circuit 1426 includes a separate negative hold time logic device for each of the plurality of line interfaces, each separate negative hold time logic device may be adapted to concurrently sample a delayed instance of a distinct signal SD[a], SD[b], SD[c], . . . , SD[n] based on the clock/trigger signal 1414 and provide distinct symbol outputs S[a], S[b], S[c], . . . , S[n].

Figure 15:
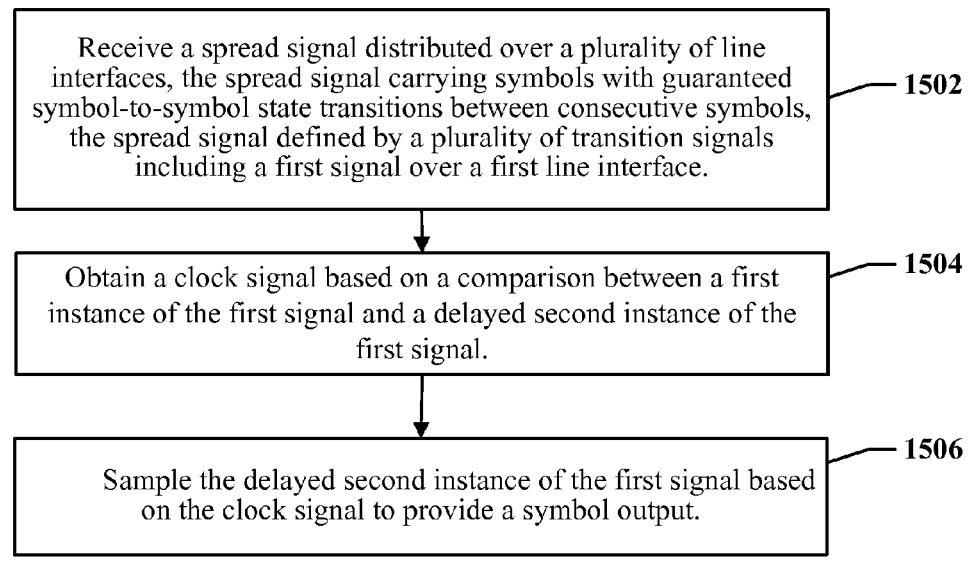
FIG. 15 illustrates a method for clock and data recovery.

FIG. 15 illustrates a method for clock and data recovery. A spread signal may be received distributed over the plurality of line interfaces, the spread signal carrying symbols with guaranteed symbol-to-symbol state transitions between consecutive symbols, the spread signal defined by a plurality of transition signals including a first signal over a first line interface 1502. In various implementations, the first signal may be a differential signal or a single-ended signal. In some examples, the spread signal may be one of a N-factorial (N!) encoded signal, a three-phase encoded signal, and/or a N-phase encoded signal.

A clock signal may be obtained based on a comparison between a first instance of the first signal and a delayed second instance of the first signal 1504. The delayed second instance of the first signal may be sampled based on the clock signal to provide a symbol output 1506. The sampling of the delayed second instance of the first signal may be done using a negative hold time logic circuit.

The clock signal may be generated based on additional comparisons between a first instance of a second signal, within the plurality of state transition signals, and a delayed second instance of the second signal, and the first signal and second signal may be concurrent signals received over different line interfaces. A delayed instance of a plurality of distinct received signals may be concurrently sampled based on the clock signal and to provide distinct symbol outputs.

In one example, obtaining a clock signal may include: (a) comparing the first instance of the first signal (SI) and the delayed instance of the first signal (SD) to provide a comparison signal (NE); (b) latching the comparison signal (NE) to obtain a filtered version of the comparison signal (NEFLT); and/or (c) delaying the filtered version of the comparison signal (NEFLT) to provide a delayed filtered version of the comparison signal (NEFLTD), where the delayed filtered version of the comparison signal (NEFLTD) serves to latch the comparison signal (NE).

According to a first aspect, illustrated in FIGS. 8 and 9, the method may further include delaying the first instance of the first signal to obtain the delayed second instance of the first signal.

According to a second aspect, illustrated in FIGS. 10 and 11, the method may further include: (a) capturing the first instance of the first signal to obtain the delayed second instance of the first signal; and/or (b) delaying the comparison signal (NE) and using the delayed comparison signal (NED) to trigger the latching of the comparison signal (NE).

According to a third aspect, illustrated in FIGS. 12 and 13, the method may further include capturing the first instance of the first signal to obtain the delayed second instance of the first signal while either the filtered version of the comparison signal (NEFLT) or the delayed filtered version of the comparison signal (NEFLTD) is in a logical high state.

It is understood that the specific order or hierarchy of steps in the processes disclosed is an illustration of exemplary approaches. Based upon design preferences, it is understood that the specific order or hierarchy of steps in the processes may be rearranged. The accompanying method claims present elements of the various steps in a sample order, and are not meant to be limited to the specific order or hierarchy presented.

While the above discussed aspects, arrangements, and embodiments are discussed with specific details and particularity, one or more of the components, steps, features and/or functions illustrated in FIGS. 1, 2, 3, 4, 5, 6, 7, 8, 9, 10, 11, 12, 13, 14, and/or 15 may be rearranged and/or combined into a single component, step, feature or function or embodied in several components, steps, or functions. Additional elements, components, steps, and/or functions may also be added or not utilized without departing from the present disclosure. The apparatus, devices and/or components illustrated in FIGS. 1, 2, 4, 5, 7, 8, 10, 12, and/or 14 may be configured to perform or employ one or more of the methods, features, parameters, and/or steps described in FIGS. 3, 6, 9, 11, 13, and/or 15. The novel algorithms described herein may also be efficiently implemented in software and/or embedded in hardware.

Also, it is noted that at least some implementations have been described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function. The various methods described herein may be partially or fully implemented by programming (e.g., instructions and/or data) that may be stored in a non-transitory machine-readable, computer-readable, and/or processor-readable storage medium, and executed by one or more processors, machines and/or devices.

Those of skill in the art would further appreciate that the various illustrative logical blocks, modules, circuits, and algorithm steps described in connection with the embodiments disclosed herein may be implemented as hardware, software, firmware, middleware, microcode, or any combination thereof. To clearly illustrate this interchangeability, various illustrative components, blocks, modules, circuits, and steps have been described above generally in terms of their functionality. Whether such functionality is implemented as hardware or software depends upon the particular application and design constraints imposed on the overall system.

The various features associate with the examples described herein and shown in the accompanying drawings can be implemented in different examples and implementations without departing from the scope of the present disclosure. Therefore, although certain specific constructions and arrangements have been described and shown in the accompanying drawings, such embodiments are merely illustrative and not restrictive of the scope of the disclosure, since various other additions and modifications to, and deletions from, the described embodiments will be apparent to one of ordinary skill in the art. Thus, the scope of the disclosure is only determined by the literal language, and legal equivalents, of the claims which follow.

What is claimed is:

1. A receiver circuit, comprising:
a plurality of line interfaces configured to receive a spread signal distributed over the plurality of line interfaces, the spread signal carrying symbols with guaranteed symbol-to-symbol state transitions between consecutive symbols, the spread signal defined by a plurality of state transition signals including a first signal over a first line interface and a second signal over a second line interface;
a clock extraction circuit adapted to obtain a clock signal based on a comparison between a first instance of the first signal and a delayed second instance of the first signal, and a comparison between a first instance of the second signal and a delayed second instance of the second signal; and
a negative hold time logic circuit adapted to sample the delayed second instance of the first signal based on the clock signal and provide a symbol output.

2. The receiver circuit of claim 1, further comprising:
a plurality of differential receivers coupled to the plurality of line interfaces, wherein the first signal is a differential signal.

3. The receiver circuit of claim 1, further comprising:
a plurality of single-ended receivers coupled to the line interfaces, wherein the first signal is a single-ended signal.

4. The receiver circuit of claim 1, wherein the spread signal is one of a N-factorial (N!) encoded signal, a three-phase encoded signal, or a N-phase encoded signal having three or more phases.

5. The receiver circuit of claim 1, wherein the first signal and second signal are concurrent signals received over different line interfaces.

6. The receiver circuit of claim 1, wherein the negative hold time logic circuit includes a separate negative hold time logic device for each of the plurality of line interfaces, each separate negative hold time logic device adapted to concurrently sample a delayed instance of a distinct received signal, within the plurality of state transition signals, based on the clock signal and provide distinct symbol outputs.

7. The receiver circuit of claim 1, wherein the clock extraction circuit includes:
a comparator that compares the first instance of the first signal (SI) and the delayed instance of the first signal (SD) and outputs a comparison signal (NE);

a set-reset latch device that receives the comparison signal (NE) and outputs a filtered version of the comparison signal (NEFLT); and a first analog delay device that delays the filtered version of the comparison signal (NEFLT) and outputs a delayed filtered version of the comparison signal (NEFLTD), where the delayed filtered version of the comparison signal (NEFLTD) serves to reset the set-reset latch device.

8. The receiver circuit of claim 7, wherein the negative hold time logic circuit includes a flip flop device that receives the delayed second instance of the first signal (SD) and outputs a symbol (S), where the flip flop device is triggered by the filtered version of the comparison signal (NEFLT).

9. The receiver circuit of claim 7, further comprising:
a second analog delay device that delays the first instance of the first signal and outputs the delayed second instance of the first signal.

10. The receiver circuit of claim 7, further comprising:
a latch device that captures the first instance of the first signal and outputs the delayed second instance of the first signal; and
a second analog delay device that delays the comparison signal (NE) and uses the delayed comparison signal (NED) to trigger the latch device.

11. The receiver circuit of claim 7, further comprising:
a latch device that captures the first instance of the first signal and outputs the delayed second instance of the first signal while either the filtered version of the comparison signal (NEFLT) or the delayed filtered version of the comparison signal (NEFLTD) is in a logical high state.

12. The receiver circuit of claim 11, further comprising:
an OR gate that receives as input the filtered version of the comparison signal (NEFLT) and the delayed filtered version of the comparison signal (NEFLTD) and outputs a signal used to trigger the latch device.

13. A method operational on a receiver circuit, comprising:
receiving a spread signal distributed over a plurality of line interfaces, the spread signal carrying symbols with guaranteed symbol-to-symbol state transitions between consecutive symbols, the spread signal defined by a plurality of state transition signals including a first signal over a first line interface and a second signal over a second line interface;
obtaining a clock signal based on a comparison between a first instance of the first signal and a delayed second instance of the first signal, and a comparison between a first instance of the second signal and a delayed second instance of the second signal; and
sampling the delayed second instance of the first signal based on the clock signal to provide a symbol output.

14. The method of claim 13, wherein the first signal is a single-ended signal.

15. The method of claim 13, wherein the spread signal is one of a N-factorial (N!) encoded signal, a three-phase encoded signal, or a N-phase encoded signal having three or more phases.

16. The method of claim 13, wherein the sampling of the delayed second instance of the first signal is done using a negative hold time logic circuit.

17. The method of claim 13, where the first signal and the second signal are concurrent signals received over different line interfaces.

18. The method of claim 13, further comprising:
concurrently sampling a delayed instance of a plurality of distinct signals, within the plurality of state transition signals, based on the clock signal and provide distinct symbol outputs.

19. The method of claim 13, wherein obtaining a clock signal includes:
comparing the first instance of the first signal (SI) and the delayed instance of the first signal (SD) to provide a comparison signal (NE);
latching the comparison signal (NE) to obtain a filtered version of the comparison signal (NEFLT); and
delaying the filtered version of the comparison signal (NEFLT) to provide a delayed filtered version of the comparison signal (NEFLTD), where the delayed filtered version of the comparison signal (NEFLTD) serves to latch the comparison signal (NE).

20. The method of claim 19, further comprising:
delaying the first instance of the first signal to obtain the delayed second instance of the first signal.

21. The method of claim 19, further comprising:
capturing the first instance of the first signal to obtain the delayed second instance of the first signal; and
delaying the comparison signal (NE) and using the delayed comparison signal (NED) to trigger the latching of the comparison signal (NE).

22. The method of claim 19, further comprising:
capturing the first instance of the first signal to obtain the delayed second instance of the first signal while either the filtered version of the comparison signal (NEFLT) or the delayed filtered version of the comparison signal (NEFLTD) is in a logical high state.

23. A receiver circuit, comprising:
means for receiving a spread signal distributed over a plurality of line interfaces, the spread signal carrying symbols with guaranteed symbol-to-symbol state transitions between consecutive symbols, the spread signal defined by a plurality of state transition signals including a first signal over a first line interface and a second signal over a second line interface;
means for obtaining a clock signal based on a comparison between a first instance of the first signal and a delayed second instance of the first signal, and a comparison between a first instance of the second signal and a delayed second instance of the second signal; and
means for sampling the delayed second instance of the first signal based on the clock signal to provide a symbol output.

24. The receiver circuit of claim 23, where the first signal and second signal are concurrent signals received over different line interfaces.

25. The receiver circuit of claim 23, further comprising:
means for concurrently sampling a delayed instance of a plurality of distinct signals, within the plurality of state transition signals, based on the clock signal and provide distinct symbol outputs.

26. The receiver circuit of claim 23, wherein obtaining a clock signal includes:
means for comparing the first instance of the first signal (SI) and the delayed instance of the first signal (SD) to provide a comparison signal (NE);
means for latching the comparison signal (NE) to obtain a filtered version of the comparison signal (NEFLT); and
means for delaying the filtered version of the comparison signal (NEFLT) to provide a delayed filtered version of the comparison signal (NEFLTD), where the delayed filtered version of the comparison signal (NEFLTD) serves to latch the comparison signal (NE).

27. The receiver circuit of claim 26, further comprising:
means for delaying the first instance of the first signal to obtain the delayed second instance of the first signal.

28. The receiver circuit of claim 26, further comprising:
means for capturing the first instance of the first signal to obtain the delayed second instance of the first signal; and
means for delaying the comparison signal (NE) and using the delayed comparison signal (NED) to trigger the latching of the comparison signal (NE).

29. The receiver circuit of claim 26, further comprising:
means for capturing the first instance of the first signal to obtain the delayed second instance of the first signal while either the filtered version of the comparison signal (NEFLT) or the delayed filtered version of the comparison signal (NEFLTD) is in a logical high state.

* * * * *